United States Patent
Lu et al.

(10) Patent No.: US 7,999,317 B2
(45) Date of Patent: Aug. 16, 2011

(54) SEMICONDUCTOR DEVICE AND MANUFACTURING METHOD THEREOF

(75) Inventors: Hong-Fei Lu, Matsumoto (JP); Mizushima Tomonori, Matsumoto (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 76 days.

(21) Appl. No.: 12/318,868

(22) Filed: Jan. 9, 2009

(65) Prior Publication Data

US 2009/0194785 A1      Aug. 6, 2009

(30) Foreign Application Priority Data

Jan. 11, 2008   (JP) .................................. 2008-005013

(51) Int. Cl.
*H01L 29/66* (2006.01)

(52) U.S. Cl. ......... 257/342; 257/E21.382; 257/E29.197; 257/409; 257/493; 438/135; 438/138; 438/435; 438/286

(58) Field of Classification Search .................. 438/135, 438/138, 435, 286, 137, 268, 454; 257/492, 257/E21.382, E29.197, 491, 493, 409, 327, 257/147, 152–153, 339, 342, 119, 124, 139, 257/335, E29.261, E21.417
See application file for complete search history.

(56) References Cited

U.S. PATENT DOCUMENTS

| | | | |
|---|---|---|---|
| 5,079,602 A | | 1/1992 | Harada et al. |
| 5,304,827 A | * | 4/1994 | Malhi et al. ................. 257/262 |
| 5,326,993 A | * | 7/1994 | Iwamuro ...................... 257/139 |
| 5,349,225 A | * | 9/1994 | Redwine et al. .............. 257/336 |
| 5,397,905 A | | 3/1995 | Otsuki et al. |
| 5,514,608 A | * | 5/1996 | Williams et al. .............. 438/286 |
| 5,644,150 A | * | 7/1997 | Iwamuro ...................... 257/147 |
| 5,665,988 A | * | 9/1997 | Huang .......................... 257/133 |

(Continued)

FOREIGN PATENT DOCUMENTS

JP        01-125979        5/1989

(Continued)

OTHER PUBLICATIONS

Disney et al., "SOI LIGBT Devices with a Dual P-Well Implant for Improved Latching Characteristics," 5th International Symposium on Power Semiconductor Devices and ICs, pp. 254-258, IEEE.

(Continued)

*Primary Examiner* — Wael M Fahmy
*Assistant Examiner* — Ankush K Singal
(74) *Attorney, Agent, or Firm* — Rabin & Berdo, P.C.

(57) ABSTRACT

A p-type body region and an n-type buffer region are formed on an $n^-$ drift region. An $n^{++}$ emitter region and a $p^{++}$ contact region are formed on the p-type body region in contact with each other. A $p^{++}$ collector region is formed on the n-type buffer region. An insulating film is formed on the $n^-$ drift region, and a gate insulating film is formed on the $n^{++}$ emitter region, the p-type body region, and the n drift region. A gate electrode is formed on the insulating film and the gate insulating film. A $p^+$ low-resistivity region is formed in the p-type body region and surrounding the interface between the $n^{++}$ emitter region and between the p-type body region and the $p^{++}$ contact region. The p-type body region has two local maxima of an impurity concentration profile at the interface between the body region and the gate insulating film.

10 Claims, 23 Drawing Sheets

U.S. PATENT DOCUMENTS

| | | | |
|---|---|---|---|
| 5,970,343 A * | 10/1999 | Kocon | 438/268 |
| 6,064,086 A * | 5/2000 | Nakagawa et al. | 257/335 |
| 6,117,738 A * | 9/2000 | Tung | 438/286 |
| 6,130,458 A * | 10/2000 | Takagi et al. | 257/351 |
| 6,222,233 B1 * | 4/2001 | D'Anna | 257/343 |
| 6,242,787 B1 * | 6/2001 | Nakayama et al. | 257/493 |
| 6,424,005 B1 * | 7/2002 | Tsai et al. | 257/335 |
| 6,528,848 B1 | 3/2003 | Hoshino et al. | |
| 6,677,622 B2 * | 1/2004 | Suzuki et al. | 257/147 |
| 6,974,753 B2 * | 12/2005 | Beasom | 438/306 |
| 7,238,987 B2 * | 7/2007 | Ikuta et al. | 257/343 |
| 7,265,416 B2 * | 9/2007 | Choi et al. | 257/343 |
| 7,268,045 B2 | 9/2007 | Hower et al. | |
| 7,531,888 B2 * | 5/2009 | Cai | 257/556 |
| 7,602,025 B2 * | 10/2009 | Nishimura et al. | 257/378 |
| 7,605,040 B2 * | 10/2009 | Choi et al. | 438/286 |
| 7,671,411 B2 * | 3/2010 | You et al. | 257/343 |
| 7,719,086 B2 * | 5/2010 | Ikuta et al. | 257/556 |
| 7,786,532 B2 * | 8/2010 | Terashima | 257/336 |
| 2001/0012671 A1 | 8/2001 | Hoshino et al. | |
| 2002/0005559 A1 * | 1/2002 | Suzuki | 257/492 |
| 2002/0017697 A1 * | 2/2002 | Kitamura et al. | 257/492 |
| 2002/0030224 A1 * | 3/2002 | Hshieh et al. | 257/329 |
| 2002/0048855 A1 * | 4/2002 | Matsudai et al. | 438/135 |
| 2002/0125542 A1 * | 9/2002 | Suzuki et al. | 257/500 |
| 2003/0107050 A1 * | 6/2003 | Letavic et al. | 257/148 |
| 2003/0141559 A1 * | 7/2003 | Moscatelli et al. | 257/406 |
| 2005/0067653 A1 * | 3/2005 | Litwin et al. | 257/335 |
| 2005/0085023 A1 * | 4/2005 | Letavic et al. | 438/151 |
| 2005/0205897 A1 * | 9/2005 | Depetro et al. | 257/213 |
| 2006/0113592 A1 * | 6/2006 | Pendharkar et al. | 257/335 |
| 2006/0118902 A1 * | 6/2006 | Ikuta et al. | 257/491 |
| 2007/0120201 A1 * | 5/2007 | Yamaguchi et al. | 257/401 |
| 2008/0012043 A1 * | 1/2008 | Udrea et al. | 257/163 |
| 2008/0135972 A1 * | 6/2008 | Ikuta et al. | 257/492 |
| 2008/0179663 A1 * | 7/2008 | Terashima | 257/328 |
| 2009/0057712 A1 * | 3/2009 | Terashima | 257/141 |

FOREIGN PATENT DOCUMENTS

| | | |
|---|---|---|
| JP | 06-244430 | 9/1994 |
| JP | 2001-094094 | 4/2001 |
| JP | 2002-270844 | 9/2002 |
| JP | 2005-109226 | 4/2005 |
| JP | 2006-165145 | 6/2006 |

OTHER PUBLICATIONS

Mok et al., "A Self-Aligned Trenched Cathode Lateral Insulated Gate Bipolar Transistor with High Latch-up Resistance," IEEE Transactions on Electron Devices, 1995, vol. 42, No. 12, p. 2236-2239, IEEE.

* cited by examiner

US 7,999,317 B2

SEMICONDUCTOR DEVICE AND MANUFACTURING METHOD THEREOF

CROSS-REFERENCE TO RELATED APPLICATION

This application claims the benefit of priority of Japanese patent application number 2008-005013, filed on Jan. 11, 2008, the entire disclosure of which is incorporated herein by reference.

BACKGROUND OF THE INVENTION

1. Field of the Invention

The invention relates to an insulated-gate semiconductor device and a manufacturing method thereof.

2. Description of the Related Art

Power devices manufactured by using SOI (silicon on insulator) substrates are known. Thick film SOI substrates are used for vehicular engine control and in drive circuits of plasma displays because they make it possible to isolate devices from each other easily by forming trenches and possible to suppress variations in manufacturing because they have a thick silicon layer. Example power devices that are manufactured by using SOI substrates include IGBTs (insulated-gate bipolar transistors) and MOSFETs (metal oxide semiconductor field-effect transistors).

Examples of power devices having conventional structures will be described below. In this disclosure and the accompanying drawings, symbols n and p that refer to layers or regions indicate that carriers of the layers or regions are electrons and holes, respectively. Superscripts "+" and "−" that accompany symbols n or p to form symbols $n^+$ and $n^-$, for example, indicate that the impurity concentrations of semiconductors that are given the symbols $n^+$ and $n^-$, for example, are higher than and lower, respectively, than the impurity concentration of a semiconductor that is given the symbol n, for example.

FIGS. 22-27 show the configurations of example power devices having conventional structures. In a semiconductor device 100 shown in FIG. 22, a buried oxide (BOX) region 102 is formed on the surface of a support substrate 101. A high-resistivity $n^-$ drift region 103 is formed on the surface of the BOX region 102. Therefore, the BOX region 102 insulates the n drift region 103 and the support substrate 101 from each other. A p-type body region 104 is formed as a partial surface region of the n drift region 103. An $n^+$ emitter region 105 which is lower in resistivity than the $n^-$ drift region 103 is formed as a partial surface region of the p-type body region 104 and a $p^+$ contact region 106 is formed as another partial surface region of the p-type body region 104 so as to be in contact with the $n^+$ emitter region 105. Part of the $p^+$ contact region 106 is located under part of the $n^+$ emitter region 105.

An n-type buffer region 107 which is lower in resistivity than the $n^-$ drift region 103 is formed as a partial surface region of the $n^-$ drift region 103 so as to be disposed away from the p-type body region 104. A $p^+$ collector region 108 which is lower in resistivity than the p-type body region 104 is formed as a partial surface region of the n-type buffer region 107.

An insulating film 109 is laid on part of the surface of the $p^+$ collector region 108, the surface of the n-type buffer region 107, and part of the surface of the $n^-$ drift region 103. A gate insulating film 110 is laid on part of the surface of the $n^+$ emitter region 105, the surface of the p-type body region 104, and part of the surface of the $n^-$ drift region 103 so as to be in contact with the insulating film 109. A gate electrode 111 is formed over the $n^+$ emitter region 105, the p-type body region 104, and the $n^-$ drift region 103, with the gate insulating film 110 and part of the insulating film 109 interposed between the gate electrode 111 and the p-type body region 401.

An emitter electrode 113 is formed so as to be in contact with the $n^+$ emitter region 105 and the $p^+$ contact region 106 and thereby short-circuits them. A collector electrode 114 is formed so as to be in contact with the $p^+$ collector region 108. The semiconductor device 100 shown in FIG. 22 thus is a lateral IGBT structure. If the $p^+$ collector region 108 is replaced by an n-type region that is lower in resistivity than the n-type buffer region 107, the resulting semiconductor device is a MOSFET structure.

In the semiconductor device 100, a pnp bipolar transistor includes the $p^+$ collector region 108, the n-type region consisting of the n-type buffer region 107 and the $n^-$ drift region 103, and the p-type body region 104. An npn bipolar transistor includes the $n^+$ emitter region 105, the p-type body region 104, and the n drift region 103 which constitutes a parasitic thyristor. To prevent latch-up that would otherwise be caused by the parasitic thyristor, an upper limit is set for the on-current.

The upper limit of the on-current can be increased by preventing the npn bipolar transistor from operating. This is attained by decreasing the resistance of a current path 115 that extends from the end of the channel to the $p^+$ contact region 106 past the portion located under the $n^+$ emitter region 105. In the following, this current path will be referred to as "under-emitter current path."

Next, a method for reducing the resistance of the under-emitter current path 115 will be described. A semiconductor device 200 shown in FIG. 23 is described in JP-A-2005-109226, US 2002/125542A1 (corresponds to JP-A-2002-270844), and D. R. Disney et al., "SOI LIGBT Devices with a Dual p-Well Implant for Improved Latching Characteristics," Int. Sym. Power Semi. Dev. ICs 1993, pp. 254-258. In the semiconductor device 200 shown in FIG. 23, a $p^+$ low-resistivity region 141 which is lower in resistivity than the p-type body region 104 is formed under the $n^+$ emitter region 105 and the $p^+$ contact region 106, whereby the resistance of the under-emitter current path 115 is reduced. The low-resistivity region 141 is formed by ion implantation. Layers, regions, etc. having similar features as those in FIG. 22 are given the same reference symbols as the latter and will not be further described.

Uncertainty in the length of the under-emitter current path 115 is eliminated and that length is minimized by forming the low-resistivity region 141 under the $n^+$ emitter region 105 using the gate electrode 111 as a mask. The method for forming the low-resistivity region 141 that can be self-aligned with the gate electrode 111 in the above manner is known (refer to U.S. Pat. No. 5,079,602 (corresponds to JP-B-8-17233) and Philip K. T. Mok et al., "A Self-aligned Trenched Cathode Lateral Insulated Gate Bipolar Transistor with High Latch-up Resistance," IEEE Transactions on Electron Devices, Vol. 42, No. 12, December 1995, pp. 2,236-2,239, for example).

Another method is known in which to lower the current amplification efficiency of the npn transistor a p-type low-resistivity region which is lower in resistivity than the p-type body region is formed as a bottom region of the p-type body region.

Next, a description will be made of semiconductor devices in which a low-resistivity region is formed as a bottom region of the p-type body region.

A semiconductor device 300 shown in FIG. 24 is described in the above-mentioned U.S. Pat. No. 5,079,602. In the semiconductor device 300 shown in FIG. 24, an $n^-$ drift region 103 is formed on the surface of a low-resistivity p⁺ substrate 301. A p-type body region 104 is formed as a partial surface region of the n⁻ drift region 103. An n⁺ emitter region 105 is formed as a partial surface region of the p-type body region 104. A trench 302 is formed approximately at the center of the p-type body region 104 so as to be adjacent to the n⁺ emitter region 105. An emitter electrode 113 is formed on the inside surface of the trench 302 so as to electrically connect the p-type body region 104 and the n⁺ emitter region 105. A gate electrode 111 is formed on part of the surface of the n⁺ emitter region 105, the surface of the p-type body region 104, and part of the surface of the n drift region 103 with a gate insulating film 110 interposed in between. A p⁺ low-resistivity region 142 which is lower in resistivity than the p-type body region 104 is formed in the p-type body region 104 around the bottom surface of the trench 302. The p⁺ low-resistivity region 142 is formed by diffusing a high-concentration p-type impurity from the bottom surface of the trench 302. A collector electrode 114 is formed on the surface of the p⁺ substrate 301 which is opposite to its surface that is in contact with the n⁻ drift region 103.

A semiconductor device 400 shown in FIG. 25 is described in JP-A-6-24430. In the semiconductor device 400 shown in FIG. 25, an n⁻ drift region 103 is formed on the surface of a p⁺ substrate 301. A p-type body region 104 is formed as a partial surface region of the n drift region 103. An n⁺ emitter region 105, an n⁺ first region 401, and an n⁺ second region 402 are formed as partial surface regions of the p-type body region 104 so as to be spaced from each other. A first gate electrode 111a is formed on the surface of that portion of the p-type body region 104 which is located between the n⁻ drift region 103 and the n⁺ emitter region 105 with a first gate insulating film 110a interposed in between. A second gate electrode 111b is formed on the surface of that portion of the p-type body region 104 which is located between the n⁺ first region 401 and the n⁺ second region 402 with a second gate insulating film 110b interposed in between. A first emitter electrode 113a is formed so as to be in contact with the n⁺ emitter region 105, and a second emitter electrode 113b is formed so as to be in contact with the n⁺ second region 402. The first emitter electrode 113a and the second emitter electrode 113b are connected to each other electrically. A short-circuiting electrode 403 short-circuits the p-type body region 104 and the n⁺ first region 401.

A p⁺ low-resistivity region 142 which is lower in resistivity than the p-type body region 104 is formed under the n⁺ emitter region 105, the n⁺ first region 401, and the region located between these regions around the boundary between the p-type body region 104 and the n⁻ drift region 103. A p⁺ diffusion region 143 is formed, by boron ion implantation and thermal diffusion, as a partial surface region of the p-type body region 104 between the n⁺ emitter region 105 and the n⁺ first region 401 so as to be in contact with the p⁺ low-resistivity region 142. The p⁺ diffusion region 143 partially occupies the region under the n⁺ emitter region 105 and the region under the n⁺ first region 401 and has approximately the same width as the p⁺ low-resistivity region 142. A collector electrode 114 is formed on that surface of the p⁺ substrate 301 which is opposite to its surface that is in contact with the n⁻ drift region 103.

A semiconductor device 500 shown in FIG. 26 is described in U.S. Pat. No. 7,268,045. In the semiconductor device 500 shown in FIG. 26, an n⁻ well layer as an n⁻ drift region 503 is formed on the surface of a p⁺ or p⁻ epitaxial substrate 501. A p-type body region 504 is formed as a partial body region of the n⁻ drift region 503. An n⁺⁺ source region 505 and a p⁺⁺ contact region 506 which is in contact with the n⁺⁺ source region 505 are formed as partial surface regions of the p-type body region 504.

An n-type buffer region 507 which is lower in resistivity than the n⁻ drift region 503 is formed as a partial surface region of the drift region 503 so as to be spaced from the p-type body region 504. An n⁺⁺ drain region 508 is formed as a partial surface region of the n-type buffer region 507. A source electrode 513 is formed so as to be in contact with the n⁺⁺ source region 505 and the p⁺⁺ contact region 506 and short-circuits them. An insulating film 509 is laid on part of the surface of the n⁺⁺ drain region 508, the surface of the n-type buffer region 507, and part of the surface of the n⁻ drift region 503. A gate electrode 511 is formed on part of the surface of the n⁺⁺ source region 505, the surface of the p-type body region 504, and part of the surface of the n⁻ drift region 503 with a gate oxide film 510 and part of the insulating film 509 interposed in between. A drain electrode 514 is formed so as to be in contact with the n⁺⁺ drain region 508. A p⁺ low-resistivity region 145 which is lower in resistivity than the p-type body region 504 is formed under the n⁺⁺ source region 505 and the p⁺⁺ contact region 506 around the boundary between the n⁻ drift region 503 and the p-type body region 504. The p⁺ low-resistivity region 145 is formed by ion implantation with a high acceleration energy and epitaxial growth.

A semiconductor device 600 shown in FIG. 27 is described in the above-mentioned D. R. Disney et al., "SOI LIGBT Devices with a Dual p-Well Implant for Improved Latching Characteristics," Int. Sym. Power Semi. Dev. ICs 1993, pp. 254-258. The semiconductor device 600 shown in FIG. 27 is manufactured by using an SOI substrate. The SOI substrate is configured in such a manner that an n⁻ drift region 103 is laid on a support substrate (not shown) with a BOX region 102 interposed in between. A p-type body region 104 is formed as a partial region of the n drift region 103 so as to be in contact with the BOX region 102. A p⁺ low-resistivity region 146 which is lower in resistivity than the p-type body region 104 is formed as a partial region of the p-type body region 104 so as to be in contact with the BOX region 102. An n⁺ emitter region 105 is formed as a partial surface region of the p⁺ low-resistivity region 146.

The p⁺ low-resistivity region 146 is formed after formation of a gate electrode 111 by ion implantation using the gate electrode 111 as a mask and thermal diffusion. Therefore, the p⁺ low-resistivity region 146 is self-aligned with the gate electrode 111. A diffusion lateral expansion region 147 is formed in such a manner that the p⁺ low-resistivity region 146 expands to under a gate insulating film 110 due to the lateral range of ions of the ion implantation and lateral thermal diffusion of ions.

The ion implantation may be performed either perpendicularly or slantingly with respect to the substrate. For example, U.S. Pat. No. 6,528,848B1 (corresponds to JP-A-2001-94094) discloses a radio-frequency laterally double-diffused MOSFET (RF LDMOST) which is manufactured by using a bulk substrate. In the following, the laterally double-diffused MOSFET will be referred to as LDMOST. US 2006/118902A1 (corresponds to JP-A-2006-165145) discloses an LDMOST which is manufactured by using an SOI substrate.

However, in the above techniques, the acceleration energy of the ion implantation needs to be set high because the low-resistivity region where the under-emitter current path is formed is formed by performing ion implantation in a self-aligned manner using the gate electrode as a mask. This raises a problem that the gate electrode should be so thick that ions do not pass through it at the time of the ion implantation. For example, where boron atoms are implanted at an acceleration energy of 90 keV, the thickness of the gate electrode should be 0.6 μm or more. However, in power ICs, with the recent requirement of miniaturization, the thickness of the gate electrode is generally 0.4 μm or less. Therefore, there is a problem that the above-described conventional techniques are not suitable for integration with logic circuits.

In the semiconductor device shown in FIG. 23, the current amplification efficiency of a first npn bipolar transistor which is composed of the n$^+$ emitter region 105, the p$^+$ low-resistivity region 141, the p-type body region 104, and the n$^-$ drift region 103 is lowered by the p$^+$ low-resistivity region 141. However, there is a problem that since a second npn bipolar transistor which is composed of the n$^+$ emitter region 105, the p-type body region 104, and the n$^-$ drift region 103 does not include the p$^+$ low-resistivity region 141, its current amplification efficiency is not lowered and hence is prone to a latch-up phenomenon.

A method for lowering the manufacturing cost by reducing the device area by shortening the channel length and thereby increasing the current density is known. However, in this case, the base of the second npn bipolar transistor is made thinner (i.e., the Gummel number of the base becomes smaller) and the current amplification efficiency of the transistor is increased. This results in a problem that the entire device becomes prone to the latch-up phenomenon. The Gummel number satisfies a relationship (Gummel number)∝∫p(r)dr where p(r) is the hole density at the position r.

The latch-up phenomenon can be made less likely to occur by forming the low-resistivity region in a portion of the p-type body region that is close to the n$^+$ emitter region than in a bottom portion of the p-type body region. The reason is as follows. While the bipolar transistor is on, electrons flow through the channel region that is formed around the boundary between the gate insulating film and the p-type body region and holes flow from the p$^+$ collector region to the n$^-$ drift region. Since a strong Coulomb force acts between electrons and holes, after holes enter the p-type body region, most of the holes flow immediately under the channel toward the p$^+$ contact region.

In each of the vertical devices shown in FIGS. 24 and 25, the latch-up phenomenon cannot be suppressed because the low-resistivity region is formed in the bottom portion of the p-type body region. And there is another problem that the impurity concentration of the p$^+$ low-resistivity region is limited so as not to lower the breakdown voltage of the pn junction formed by the n$^-$ drift region and the p-type body region.

The above-mentioned US 2006/118902A1 states that in the p$^+$ low-resistivity region the range of the ion implantation, that is, the maximum impurity concentration position of the ion implantation, is approximately the same as the maximum position of an impurity concentration profile of the lateral extension of the diffusion. This means a problem that the width of the p$^+$ low-resistivity region cannot be made greater than that of the lateral extension of the diffusion.

It is known that an insulated-gate transistor such as an IGBT or a MOSFET is destructed mainly in the following two cases. The first case is that the collector (drain)-emitter voltage becomes too high in an on state. This condition may be called FUL (fault under load). The second case is that the IGBT is turned off in a state that the collector-emitter voltage is fixed at a large value, that is, the resistance to short-circuiting is exceeded (HSF: hard switching fault). To increase the resistance to short-circuiting, a device structure is necessary which can suppress the latch-up phenomenon more effectively than the above-described conventional structures.

SUMMARY OF THE INVENTION

An object of the invention is to provide a semiconductor device having high short-circuit ruggedness and a manufacturing method thereof to solve the problems of the above-described prior art.

To solve the above problems and attain the above object, a first aspect of the invention provides a semiconductor device comprising a drift region of a first conductivity type, a body region of a second conductivity type formed on a surface region of the drift region, an emitter region formed on a surface region of the body region, a contact region of the second conductivity type having a lower resistivity than that of the body region, the contact region being formed on a surface region of the body region and being in contact with the emitter region, a collector region of the second conductivity type formed on a surface region of the drift region and being disposed away from the body region, a gate insulating film formed on the surface of the body region between the emitter region and the drift region, a gate electrode formed on the gate insulating film, and a low-resistivity region of the second conductivity type formed in the body region and surrounding an interface between the body region and the emitter region and an interface between the body region and the contact region, wherein the body region including the low-resistivity region has two local maxima in an impurity concentration along the interface between the body region and the gate insulating film.

A second aspect of the invention provides a semiconductor device comprising a drift region of a first conductivity type, a body region of a second conductivity type formed on a surface region of the drift region, a source region formed on a surface region of the body region, a contact region of the second conductivity type and having a lower resistivity than that of the body region, the contact region being formed on a surface region of the body region and being in contact with the source region, a drain region of the first conductivity type formed on a surface region of the drift region and being disposed away from the body region, a gate insulating film formed on the surface of the body region between the source region and the drift region, a gate electrode formed on the gate insulating film, and a low-resistivity region of the second conductivity type formed in the body region and surrounding an interface between the body region and the emitter region, and an interface between the body region and the contact region, wherein the body region including the low-resistivity region has two local maxima of an impurity concentration along an interface between the body region and the gate insulating film.

The width of that portion of the low-resistivity region, as measured from the emitter-side or source-side end of the gate electrode to underneath the gate electrode, is greater than 0.5 μm.

The width of that portion of the low-resistivity region, as measured from the emitter-side or source-side end of the gate electrode to underneath the gate electrode, is preferably greater than or equal to 1.0 μm.

The local maxima of the impurity of the low-resistivity region in the depth direction are not located at the interface between the body region and the gate insulating film.

The drift region may be formed on a support substrate with a buried insulating film interposed therebetween.

The drift region may be formed on a surface of a semiconductor substrate of the second conductivity type.

A third aspect of the invention provides a manufacturing method of a semiconductor device, comprising the steps of forming a drift region of a first conductivity type, forming a body region of a second conductivity type on a surface of the drift region, forming a low-resistivity region of the second conductivity type in the body region, the low-resistivity region being lower in resistivity than the body region, forming an emitter region of the first conductivity type on a surface region of the body region, forming a contact region on a surface region of the body region, the contact region being in contact with the emitter region and being lower in resistivity than the body region, forming a collector region of the second conductivity type on a surface region of the drift region, the collector region being disposed away from the body region, forming an insulating film on a the surface of the drift region, forming a gate insulating film on the surface of the body region between the emitter region and the drift region, forming a gate electrode on the gate insulating film, forming an emitter electrode in contact with the emitter region and the contact region, and forming a collector electrode in contact with the collector region.

A fourth aspect of the invention provides a manufacturing method of a semiconductor device, comprising the steps of forming a drift region of a first conductivity type, forming a body region of a second conductivity type on a surface of the drift region, forming a low-resistivity region of the second conductivity type in the body region, the low-resistivity region being lower in resistivity than the body region, forming a source region of the first conductivity type on a surface region of the body region; forming a contact region on a surface region of the body region, the contact region being in contact with the source region and being lower in resistivity than the body region, forming a drain region of the first conductivity type on a surface region of the drift region , the drain region being disposed away from the body region, forming an insulating film on the surface of the drift region, forming a gate insulating film on the surface of the body region between the source region and the drift region, forming a gate electrode on the gate insulating film, forming a source electrode in contact with the source region and the contact region, and forming a drain electrode in contact with the drain region, wherein the forming the low-resistivity region is executed before the forming the gate electrode, and the forming the source region is executed after the forming the gate electrode.

A fifth aspect of the invention provides a manufacturing method of a semiconductor device, comprising the steps of forming a collector region of a second conductivity type, forming a drift region of a first conductivity type on one major surface of the collector region, forming a body region of the second conductivity type on a surface of the drift region, forming a low-resistivity region of the second conductivity type in the body region, the low-resistivity region being lower in resistivity than the body region, forming an emitter region of the first conductivity type on a surface region of the body region, forming a contact region on a surface region of the body region , the contact region being in contact with the emitter region and being lower in resistivity than the body region, forming an insulating film on a surface of the drift region, forming a gate insulating film on a surface of the body region between the emitter region and the drift region, forming a gate electrode on the gate insulating film,
forming an emitter electrode in contact with the emitter region and the contact region, and forming a collector electrode in contact with the collector region through the other major surface of the collector region, wherein the forming the low-resistivity region is executed before the forming the gate electrode insulating film, and the forming the emitter region is executed after the forming the gate electrode.

A sixth aspect of the invention provides a manufacturing method of a semiconductor device, comprising the steps of forming a drain region of a second conductivity type, forming a drift region of a first conductivity type on one major surface of the drain region, forming a body region of the second conductivity type on a surface of the drift region, forming a low-resistivity region of the second conductivity type in the body region, the low-resistivity region being lower in resistivity than the body region, forming a source region of the first conductivity type as a surface region of the body region, forming a contact region on a surface region of the body region , the contact region being in contact with the source region and being lower in resistivity than the body region, forming an insulating film on a surface of the drift region, forming a gate insulating film on a surface of the body region between the source region and the drift region, forming a gate electrode on the gate insulating film, forming a source electrode in contact with the source region and the contact region, and forming a drain electrode in contact with the drain region through the other major surface of the drain region, wherein the forming the low-resistivity region is executed before the forming the gate insulating film, and the forming the source region is executed after the forming the gate electrode.

The body region may be formed by lateral diffusion, and the low-resistivity region may be formed by ion implantation.

The low-resistivity region may be formed by implanting boron ions at an acceleration energy of 100 to 200 keV.

The low-resistivity region may be formed by implanting boron ions at a dose of $1 \times 10^{13}$ to $5 \times 10^{13}$ cm$^{-2}$.

Between the low-resistivity region forming step and the gate insulating film forming step, annealing may be performed at 900° C. to 960° C. for 20 to 40 minutes in a nitrogen atmosphere to repair crystal lattice disorder that may occur during the forming the low-resistivity region and preventing excessive diffusion from occurring in the low resistivity region.

According to the invention, the impurity concentration profile of the low-resistivity region has two local maxima. Therefore, the width of that portion of the low-resistivity region which is located under the gate electrode can be set at a desired value, which makes it possible to suppress a punch-through occurring in the channel.

According to the above manufacturing methods, the low-resistivity region can be formed before formation of the gate insulating film. Therefore, ions are scattered by the edge of a resist mask that is used for the ion implantation for forming the low-resistivity region and the scattered ions produce a new local maximum in the impurity concentration. As a result, two local maxima are obtained in the impurity concentration profile of the low-resistivity region.

Consequently, the semiconductor devices and their manufacturing methods according to the invention provide an advantage that their short-circuit ruggedness can be increased.

DETAILED DESCRIPTION OF THE INVENTION

Semiconductor devices and their manufacturing methods according to preferred embodiments of the invention will be hereinafter described in detail with reference to the accompanying drawings. In the following description of the embodiments and the accompanying drawings, the same layers, regions, or the like will be/are denoted by the same reference symbol and redundant descriptions will be avoided.

Embodiment 1

Figure 1:
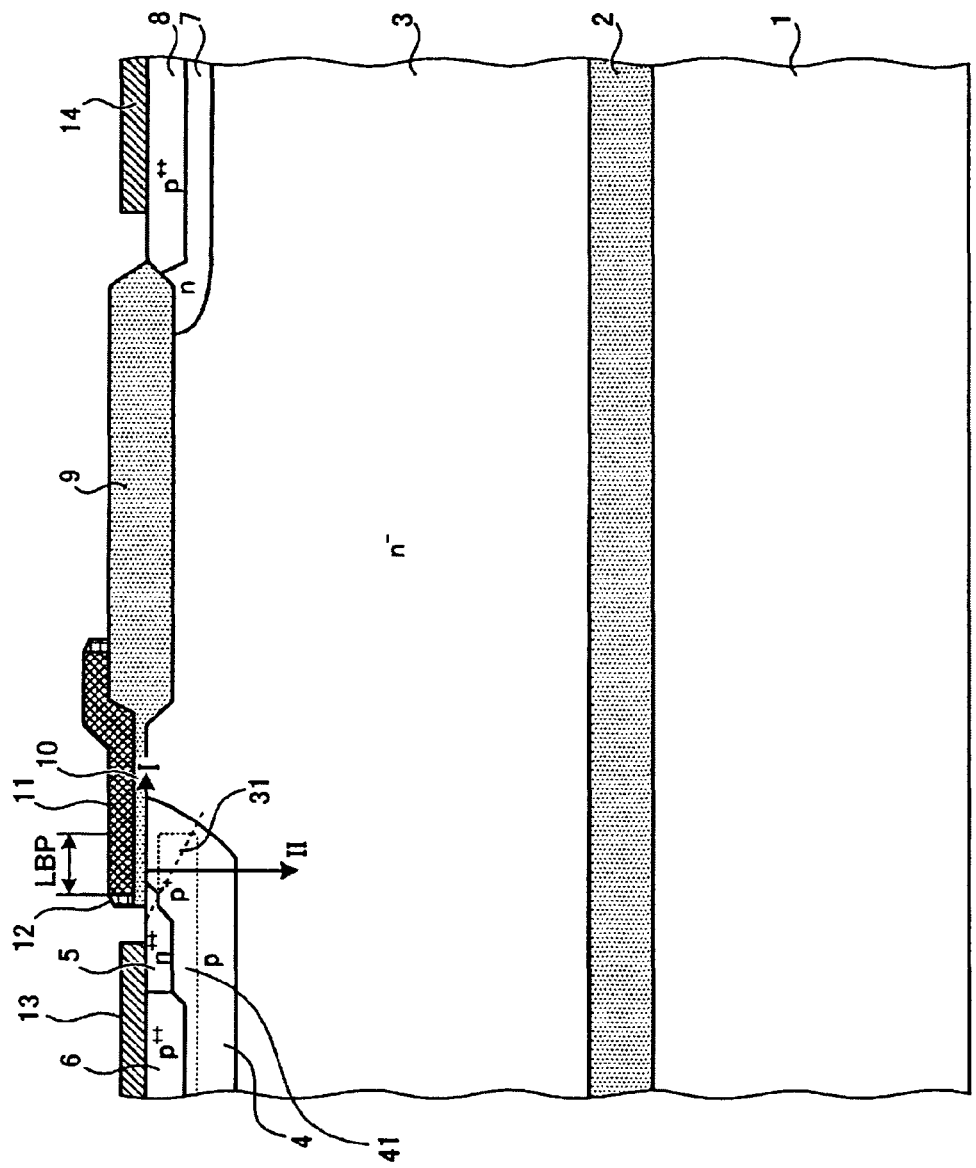
FIG. 1 shows the configuration of a semiconductor device according to a first embodiment of the invention.

FIG. 1 shows the configuration of a semiconductor device according to the first embodiment. The semiconductor device shown in FIG. 1 is manufactured by using an SOI substrate. The SOI substrate is configured in such a manner that a buried oxide (BOX) region 2 and an n drift region 3 as a first semiconductor region are laid in this order on a support substrate 1. The BOX region 2 insulates the n⁻ drift region 3 and the support substrate 1 from each other. A p-type body region 4 as a second semiconductor region is formed as a partial surface region of the n⁻ drift region 3. An n⁺⁺ emitter region 5 as a third semiconductor region is formed as a partial surface region of the p-type body region 4. The n⁺⁺ emitter region 5 is lower in resistivity than the n drift region 3. A p⁺⁺ contact region 6 is formed as a partial surface region of the p-type body region 4 so as to be in contact with the n⁺⁺ emitter region 5. The p⁺⁺ contact region 6 is lower in resistivity than the p-type body region 4. Alternatively, for example, part of the p⁺⁺ contact region 6 may extend to under the n⁺⁺ emitter region 5.

An n-type buffer region 7 is formed as a partial surface region of the n⁻ drift region 3 so as to be disposed away from the p-type body region 4. The n-type buffer region 7 is lower in resistivity than the n⁻ drift region 3. A p⁺⁺ collector region 8 is formed as a partial surface region of the n-type buffer region 7. The p⁺⁺ collector region 8 is lower in resistivity than the p-type body region 4.

An insulating film 9 is laid on part of the surface of the p⁺⁺ collector region 8, the surface of the n-type buffer region 7, and part of the surface of the n⁻ drift region 3. A gate insulating film 10 which is in contact with the insulating film 9 is formed on part of the surface of the n++emitter region 5, the surface of the p-type body region 4, and part of the surface of the n⁻ drift region 3. A gate electrode 11 is formed on part of the insulating film 9 and the gate insulating film 10. Gate sidewall spacers 12 which are nitride films or oxide films are formed on the side surfaces of the gate electrode 11. Unless otherwise specified, the ends (or edges) of the gate electrode 11 mean the interfaces between the gate electrode 11 and the gate sidewall spacers 12. An emitter electrode 13 is formed so as to be in contact with the n⁺⁺ emitter region 5 and the p⁺⁺ contact region 6 and thereby short-circuits them. A collector electrode 14 is formed in contact with the p⁺⁺ collector region 8.

A p⁺ low-resistivity region 41 occupies part of the p-type body region 4 and does not reach the interface between the gate insulating film 10 and the p-type body region 4. The p⁺ low-resistivity region 41 is lower in resistivity than the p-type body region 4. The width of that portion of the p⁺ low-resistivity region 41 which is located under the gate electrode 11 is represented by the element LBP. As such, the semiconductor device according to the first embodiment is of a lateral IGBT structure.

Figure 2:
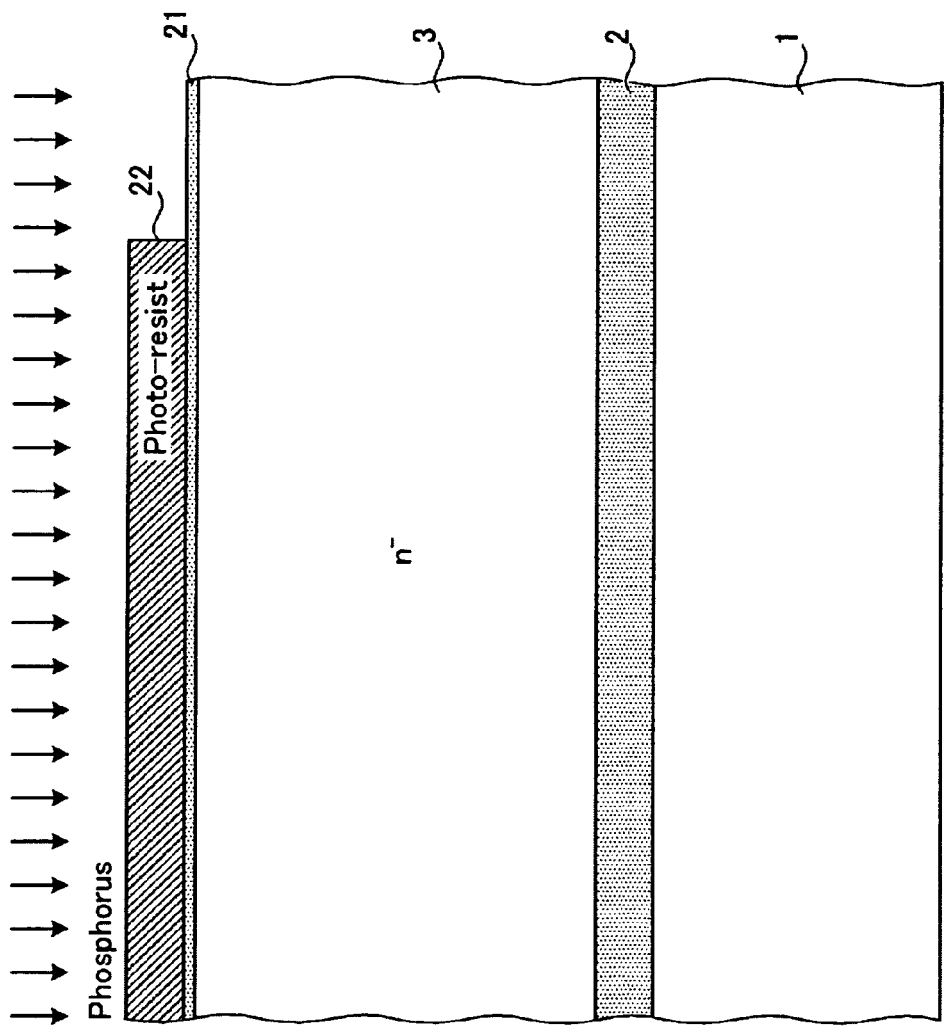
FIGS. 2-10 illustrate a manufacturing method of the semiconductor device according to the first embodiment.

Next, an example manufacturing method of the semiconductor device according to the first embodiment will be described. FIGS. 2-10 illustrate, in order, the manufacturing method of the semiconductor device according to the first embodiment. First, as shown in FIG. 2, a first screen oxide film 21 of 35 nm, for example, in thickness is deposited or grown on the entire surface of the SOI substrate. The first resist pattern 22 is formed by photolithography in such a manner that an n-type buffer region 7 forming area is opened. Phosphorus ions are implanted at an acceleration energy of 100 to 150 keV, for example, at a dose of $7.5 \times 10^{12}$ to $1.5 \times 10^{13}$ cm$^{-2}$ with the first resist pattern 22 used as a mask. The substrate (actually a wafer) is cleaned after the first resist pattern 22 is removed. Phosphorus ions are thus implanted in the n-type buffer region 7 forming area.

Figure 3:
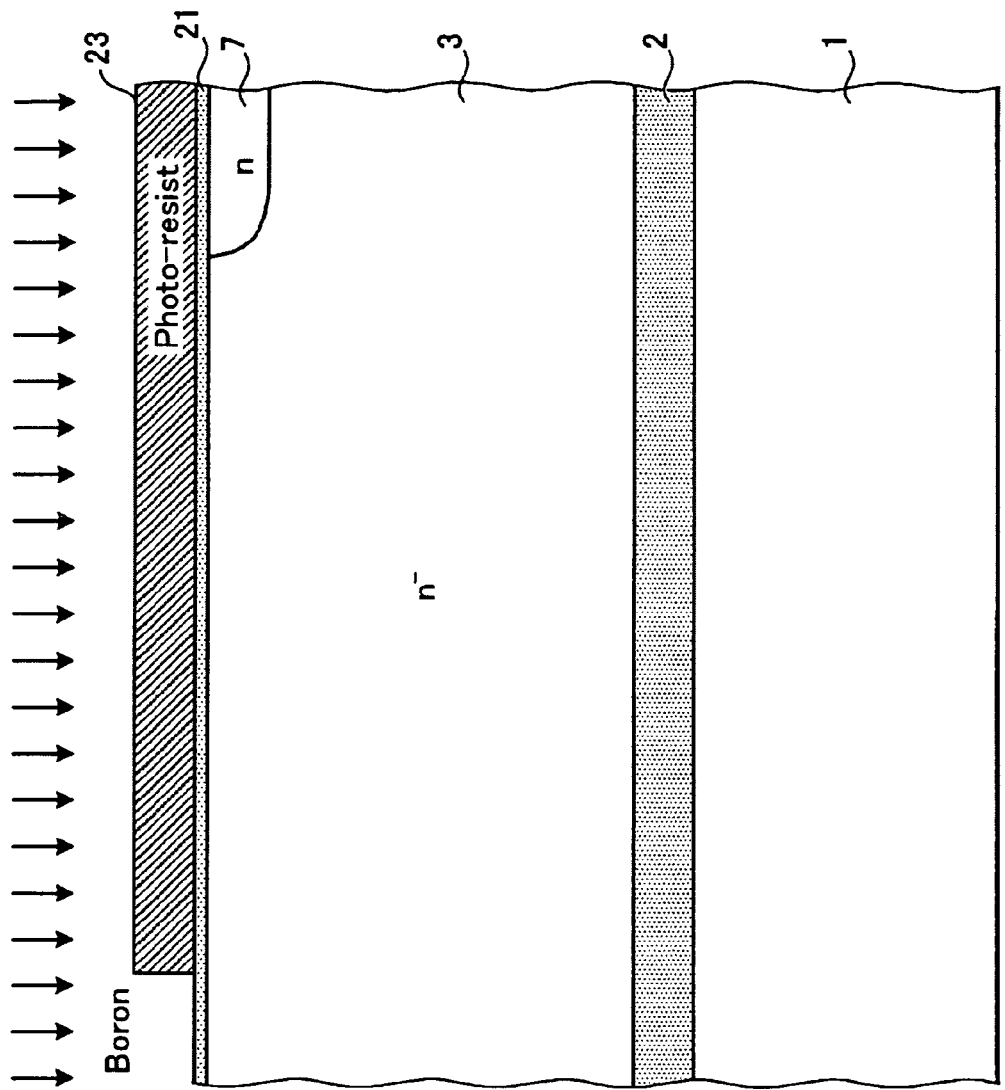

Then, as shown in FIG. 3, the second resist pattern 23 is formed by photolithography in such a manner that a p-type body region 4 forming area is opened. Boron ions are implanted at an acceleration energy of 50 keV, for example, at a dose of $5 \times 10^{13}$ to $7 \times 10^{13}$ cm$^{-2}$ with the second resist pattern 22 used as a mask. The substrate is cleaned after the second resist pattern 23 is removed. Boron ions are thus implanted in the p-type body region 4 forming area.

Figure 4:
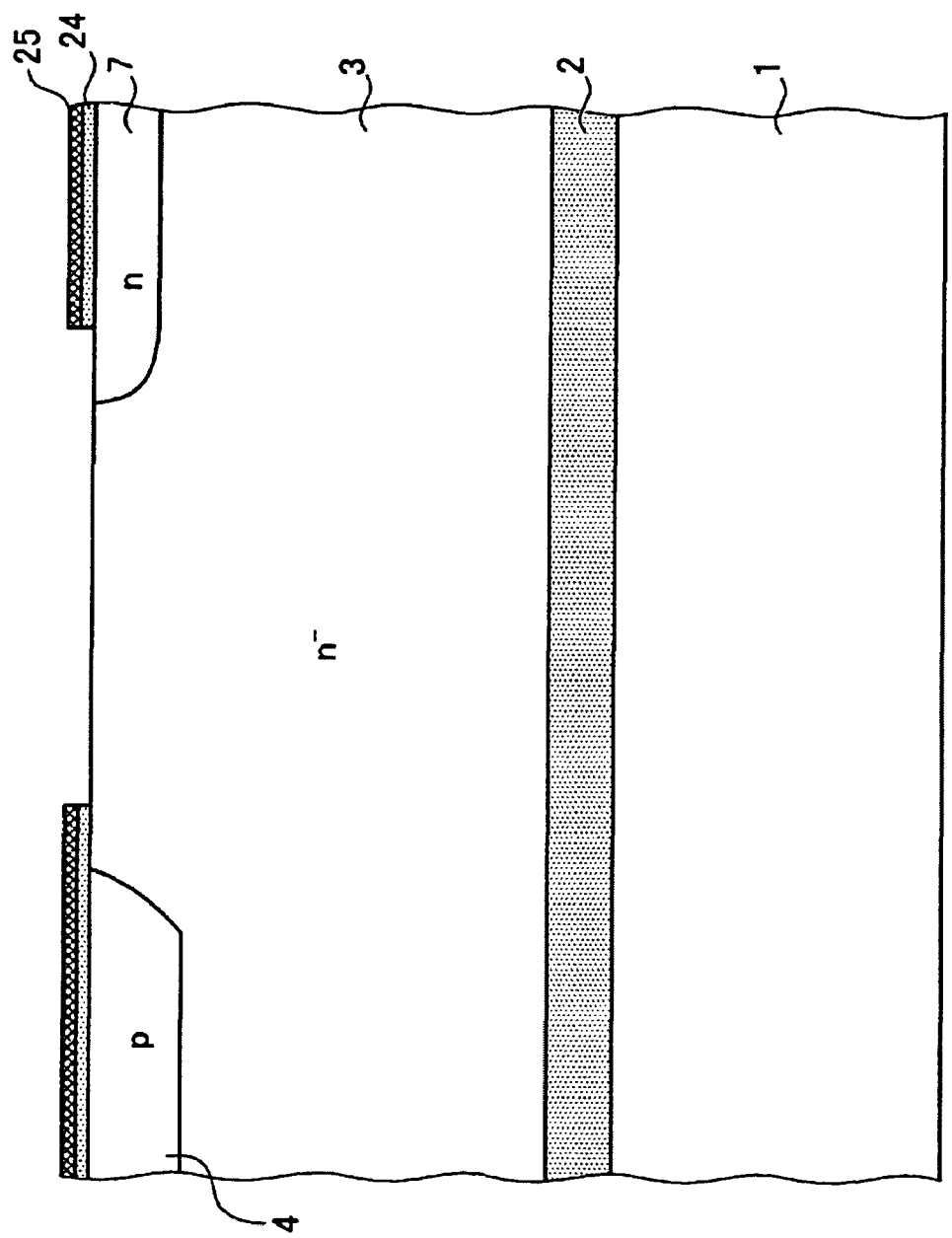

Then, as shown in FIG. 4, for example, the n-type buffer region 7 forming area and the p-type body region 4 forming area are subjected to thermal diffusion at 1,050° C. to 1,150° C. for 1.5 to 2.5 hours in a nitrogen atmosphere, whereby an n-type buffer region 7 and a p-type body region 4 are formed. After the first screen oxide film 21 is removed and a buffer oxide film 24 of 35 nm, for example, in thickness is formed, a silicon nitride film 25 of 70 to 200 nm, for example, in thickness is deposited by using an LPCVD (low-pressure chemical vapor deposition) apparatus. An opening is formed in the buffer oxide film 24 and the silicon nitride film 25 by photolithography. The substrate is cleaned after the photoresist is removed.

Figure 5:
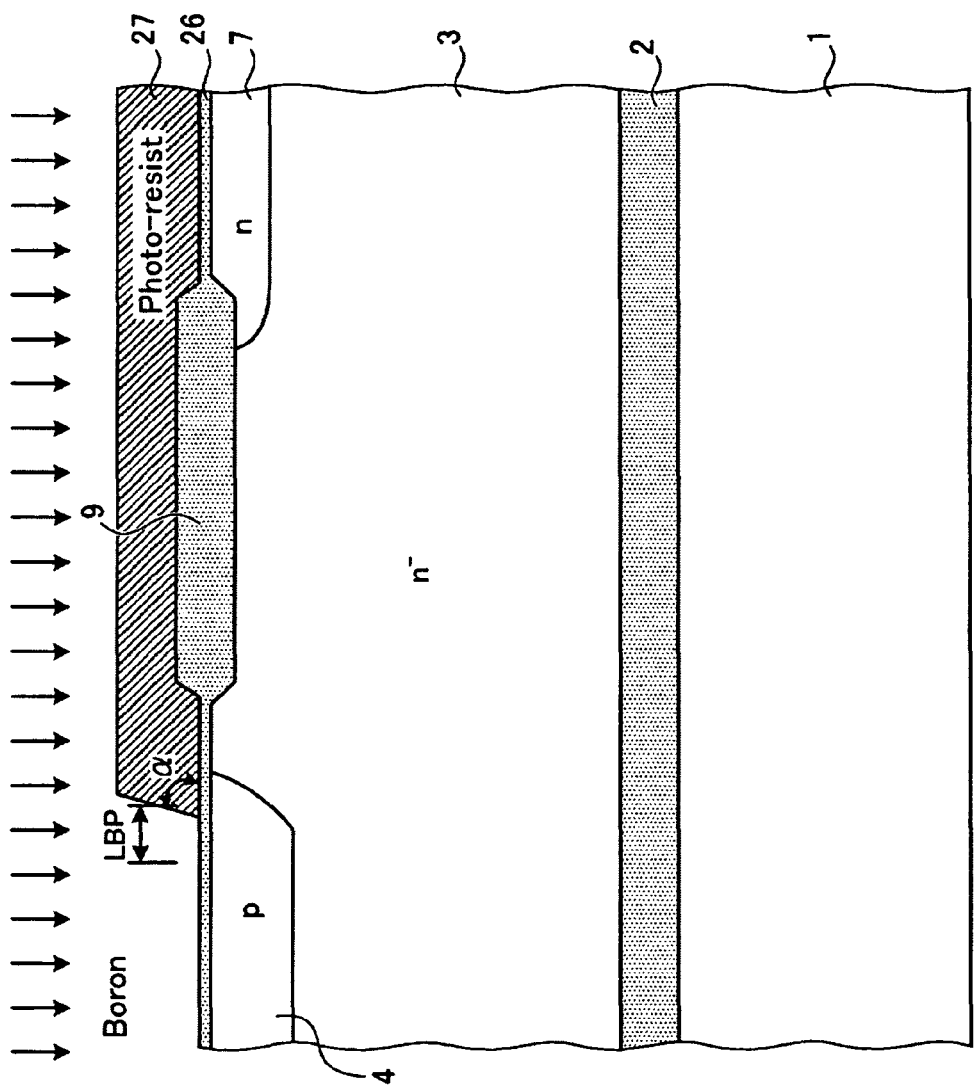

Then, as shown in FIG. 5, an insulating film 9 such as a silicon oxide film (LOCOS oxide film) is formed in the opening by thermal oxidation. The buffer oxide film 24 and the nitride film 25 are removed. Then, a second screen oxide film 26 of 35 nm, for example, in thickness is deposited or grown. The third resist pattern 27 of 1.0 to 2.0 μm, for example, in thickness is formed by photolithography in such a manner that a p+ low-resistivity region 41 forming area is opened. The angle α of the end portion of the third resist pattern 27 is 80° to 90°, for example. The width LBP from the emitter-side end of the third resist pattern 27 to the end of a low-resistivity region that is being formed and will be located under a gate electrode when the gate electrode is formed, and is set to be greater than 0.5 μm, preferably greater than or equal to 1 μm. A preferable range of the width LBP will be described later. Then, boron ions are implanted at an acceleration energy of 100 to 200 keV, for example, at a dose of $1.0 \times 10^{13}$ to $5.0 \times 10^{13}$ $cm^{-2}$. The substrate is cleaned after the third resist pattern 27 is removed.

Figure 6:
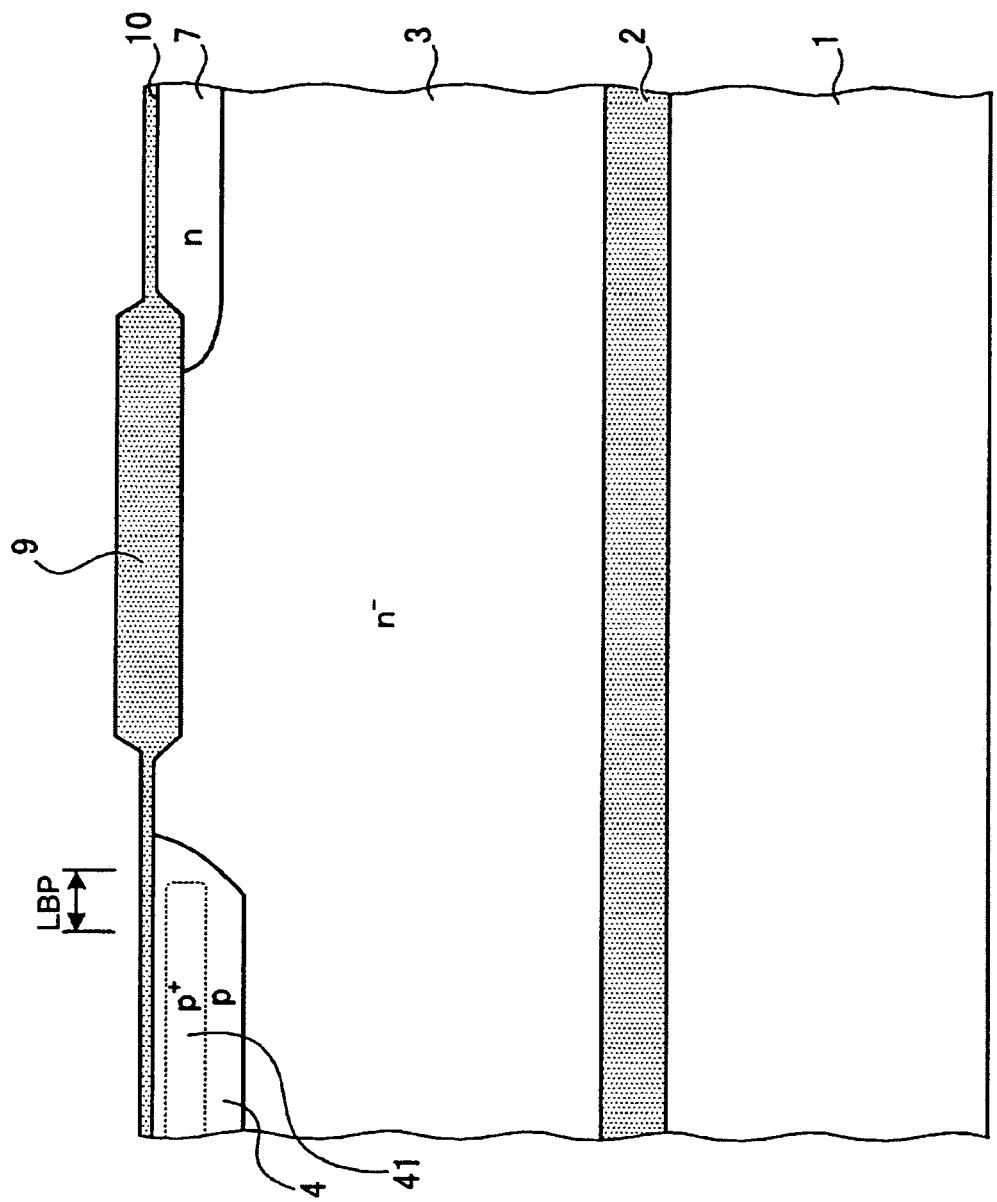

Then, the substrate is subjected to annealing at 900° C. to 960° C., for example, for 20 to 40 minutes in a nitrogen atmosphere, whereby crystal defects caused by the ion implantation are repaired while the diffusion of the boron that was implanted in the step of FIG. 5 is minimized. As a result, a p+ low-resistivity region 41 is formed as shown in FIG. 6. Then, ions are implanted over the entire substrate surface to adjust the device threshold value. After the second screen oxide film 26 is removed, a composite film of a thermal oxidation film or an oxide film and a nitride film of 14 to 21 nm, for example, in thickness is formed as a gate insulating film 10.

Figure 7:
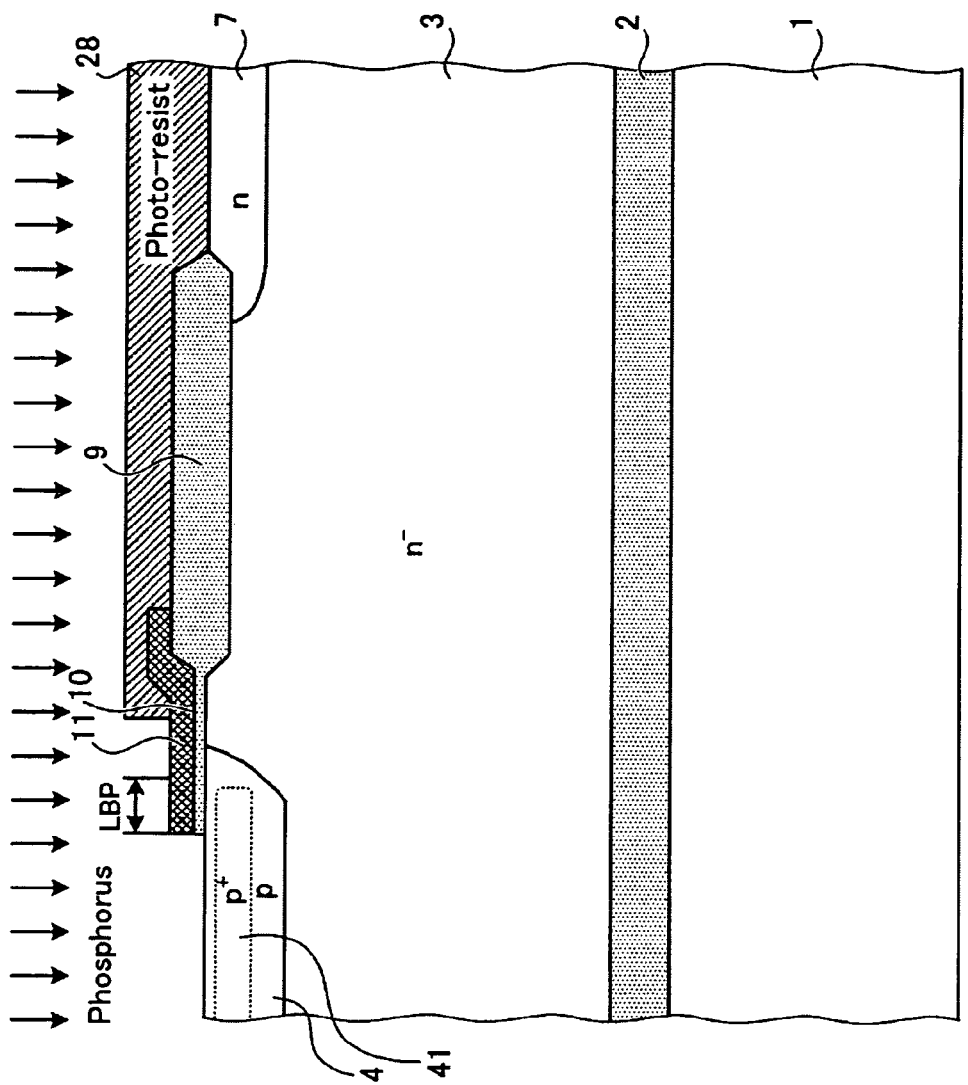
Figure 8:
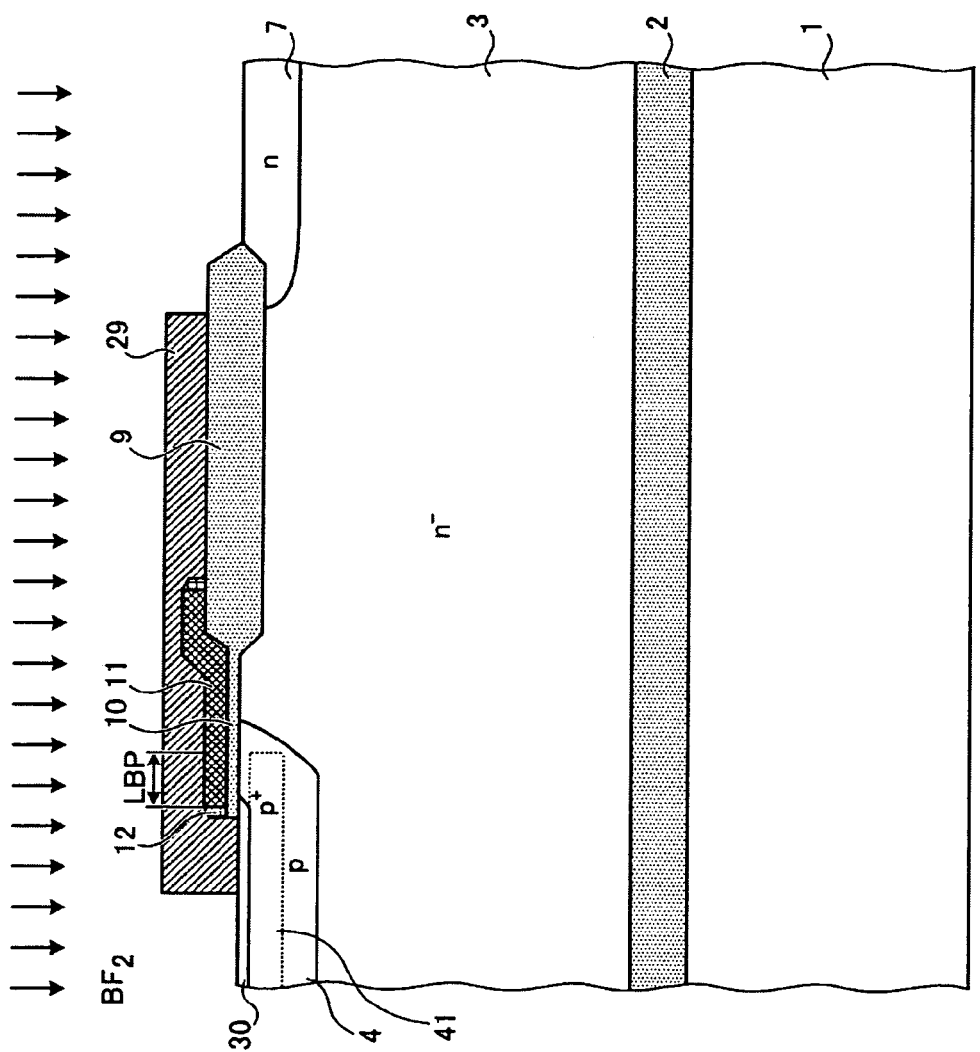

Subsequently, a polysilicon layer of 0.2 to 0.4 μm, for example, in thickness is deposited on the entire substrate surface. As shown in FIG. 7, a gate electrode 11 is formed by photolithography and anisotropic etching. Then, a fourth resist pattern 28 in which an LDD (shallow emitter) region 30 forming area is opened is formed by photolithography. As shown in FIG. 8, a shallowly doped, shallow emitter region 30 is formed by implanting phosphorus ions with the fourth resist pattern 28 used as a mask.

After the fourth resist pattern 28 is removed, gate sidewall spacers 12 are formed by depositing an oxide film or a nitride film of 130 to 180 nm in thickness over the entire substrate surface and performing anisotropic etching on it. The fifth resist pattern 29 in which a p++ contact region 6 forming area and a p++ collector region 8 forming area are opened is formed by photolithography. Boron (B) ions or $BF_2$ ions are implanted with the fifth resist pattern 29 used as a mask.

Figure 9:
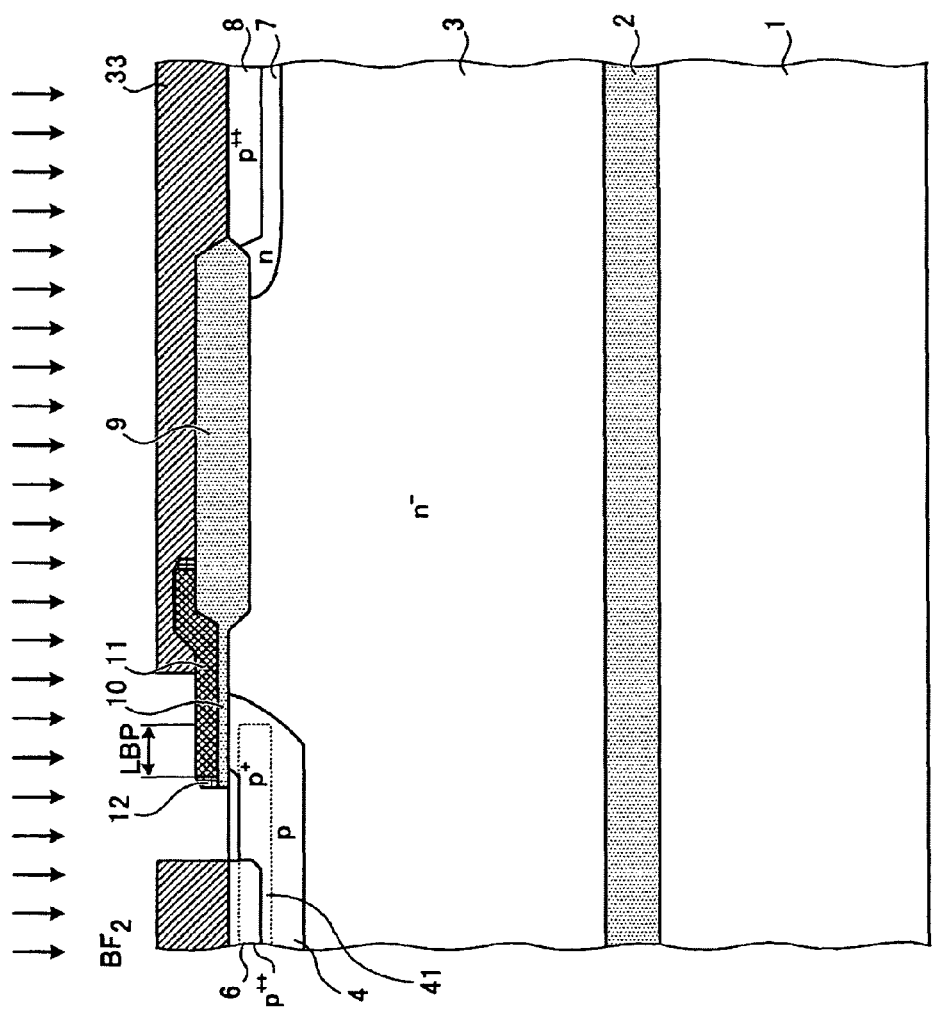

Then, heat treatment is performed, whereby thermal diffusion is caused simultaneously in the p++ contact region 6 forming area, the p++ collector region 8 forming area, and the p-type shallow emitter region 30, whereby a p++ contact region 6, a p++ collector region 8, and the n-type shallow emitter region 30 are formed (or completed). As shown in FIG. 9, the sixth resist pattern 33 in which an n++ emitter region 5 forming area is opened is formed by photolithography. Arsenic ions are implanted with the sixth resist pattern 33 as a mask. The substrate is cleaned after the sixth resist pattern 33 is removed.

Figure 10:
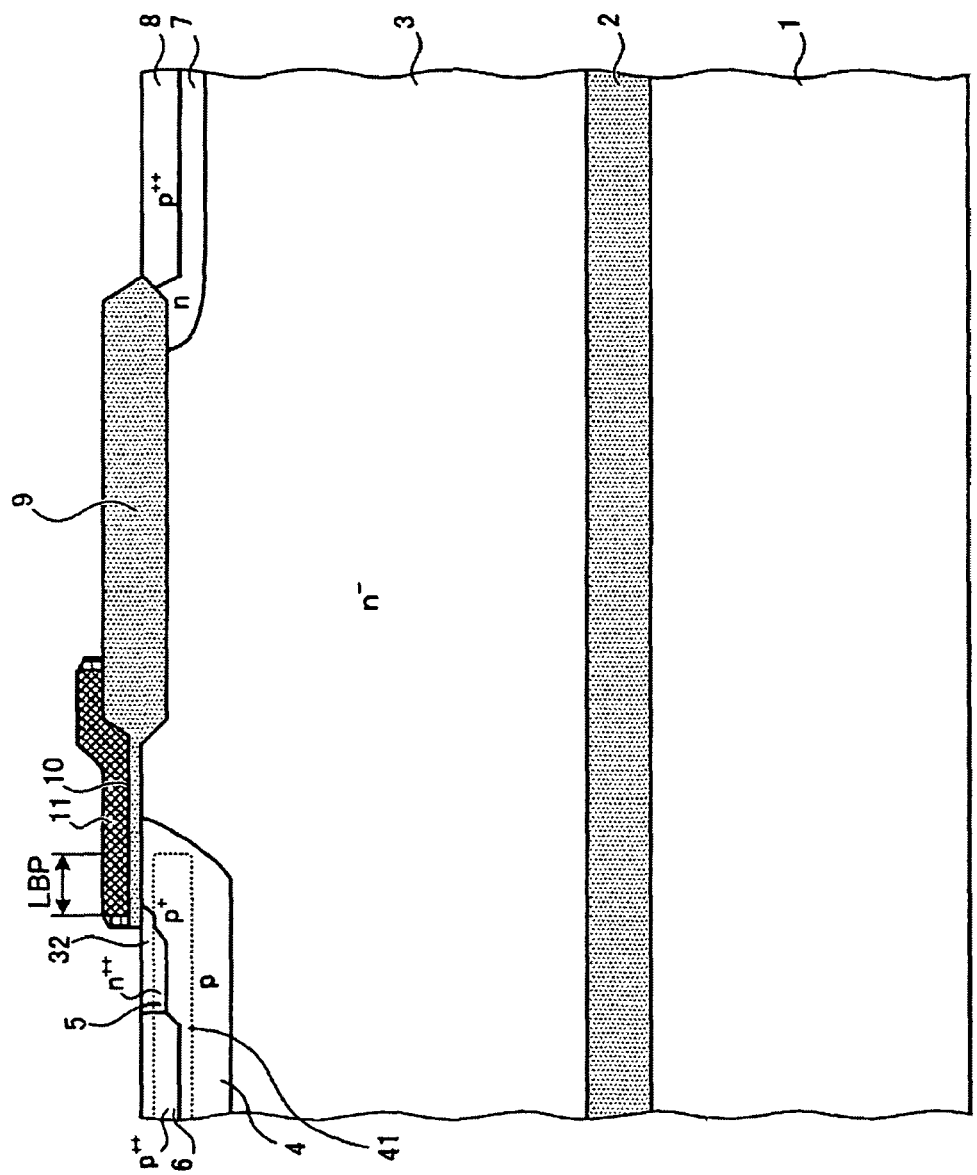

Then, heat treatment is performed, whereby an n++ emitter region 5 and an n-type shallow emitter region 32 are formed as shown in FIG. 10. A PMD (pre-metallization dielectric) film (not shown) is deposited.

Then, an emitter electrode 13 and a collector electrode 14 are formed as shown in FIG. 1. A chip is completed by forming ILD (interlayer dielectric) layers and wiring layers (including via holes) in a necessary number of layers.

Figure 11:
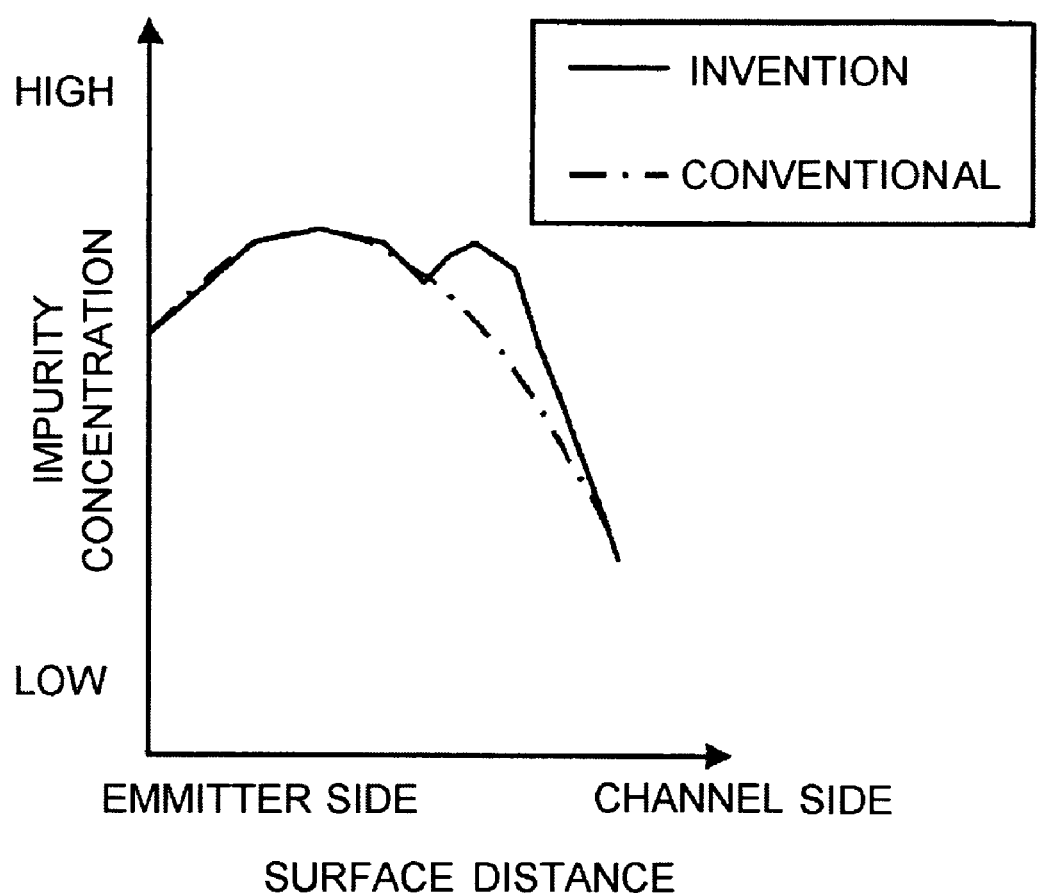
FIG. 11 is a graph showing a relationship between the surface distance and the impurity concentration at the interface between a p-type body region and a gate insulating film for each of the semiconductor device according to the first embodiment and a conventional semiconductor device.

Next, a description will be made of the impurity concentration profile at the interface between the p-type body region 4 and the gate insulating film 10 of the semiconductor device according to the first embodiment. FIG. 11 is a graph showing a relationship between the surface distance and the impurity concentration at the interface between the p-type body region and the gate insulating film for each of the semiconductor devices according to the embodiment (solid line) and a conventional semiconductor device (chain line). As shown in FIG. 11, whereas in the conventional example the impurity concentration profile has only one local maximum, that of the semiconductor device according to the embodiment has two local maxima.

In the conventional semiconductor device, the low-resistivity region is formed in a self-aligned manner with the already formed gate electrode used as a mask. Therefore, the maximum position of the impurity concentration profile of the ion implantation with respect to forming the low-resistivity region coincides with the maximum position of the impurity concentration profile of the lateral diffusion with respect to forming the p-type body region. The impurity concentration profile thus has only one local maximum.

In contrast, in the semiconductor device according to the embodiment, the low-resistivity region is formed before formation of the gate electrode. That is, the low-resistivity region is formed by using a resist mask rather than the gate electrode. Therefore, ions are scattered by the edge of the resist mask used for the ion implantation for forming the low-resistivity region and the scattered ions produce a new local maximum of the impurity concentration (mask edge effect). This local maximum position of the impurity concentration is different from the local maximum position of the impurity concentration profile of the lateral diffusion with respect to forming the p-type body region. The impurity concentration profile thus has two local maxima.

In the lateral IGBT or MOSFET structure, the p-type body region is formed by lateral diffusion from the emitter (source) region. The impurity concentration profile along the channel is such that the impurity concentration is highest in the vicinity of the emitter (source) region and the threshold voltage is determined by the impurity concentration there.

Therefore, where as in the conventional case the low-resistivity region is formed by ion implantation in a self-aligned manner after formation of the gate electrode, as seen from FIG. 11 the impurity concentration profile has only one local maximum and hence the threshold value is restricted. As a result, the ion dose of the ion implantation is restricted and the concentration of the impurity that is implanted into the p-type body region under the emitter (source) region is restricted. Therefore, the width of the low-resistivity region is in a limited range. In the ion implantation for forming the low-resistivity region, the angle and the acceleration energy of the ion implantation are restricted depending on the gate electrode thickness and hence the width LBP is also restricted. Since the width LBP cannot be set at a desired value, the effect of suppressing the punchthrough phenomenon is insufficient.

In contrast, where as in the embodiment the ion implantation for forming the low-resistivity region in the p-type body region is performed before formation of the gate electrode, as seen from FIG. 11 the impurity concentration profile can have two local maxima and hence the ion dose of the ion implantation can be increased. Since the gate electrode has not been formed yet, no restrictions are imposed on the angle and the acceleration energy of the ion implantation. Since the width LBP can be set at a desired value, the punchthrough phenomenon in the channel can be suppressed sufficiently.

Figure 12:
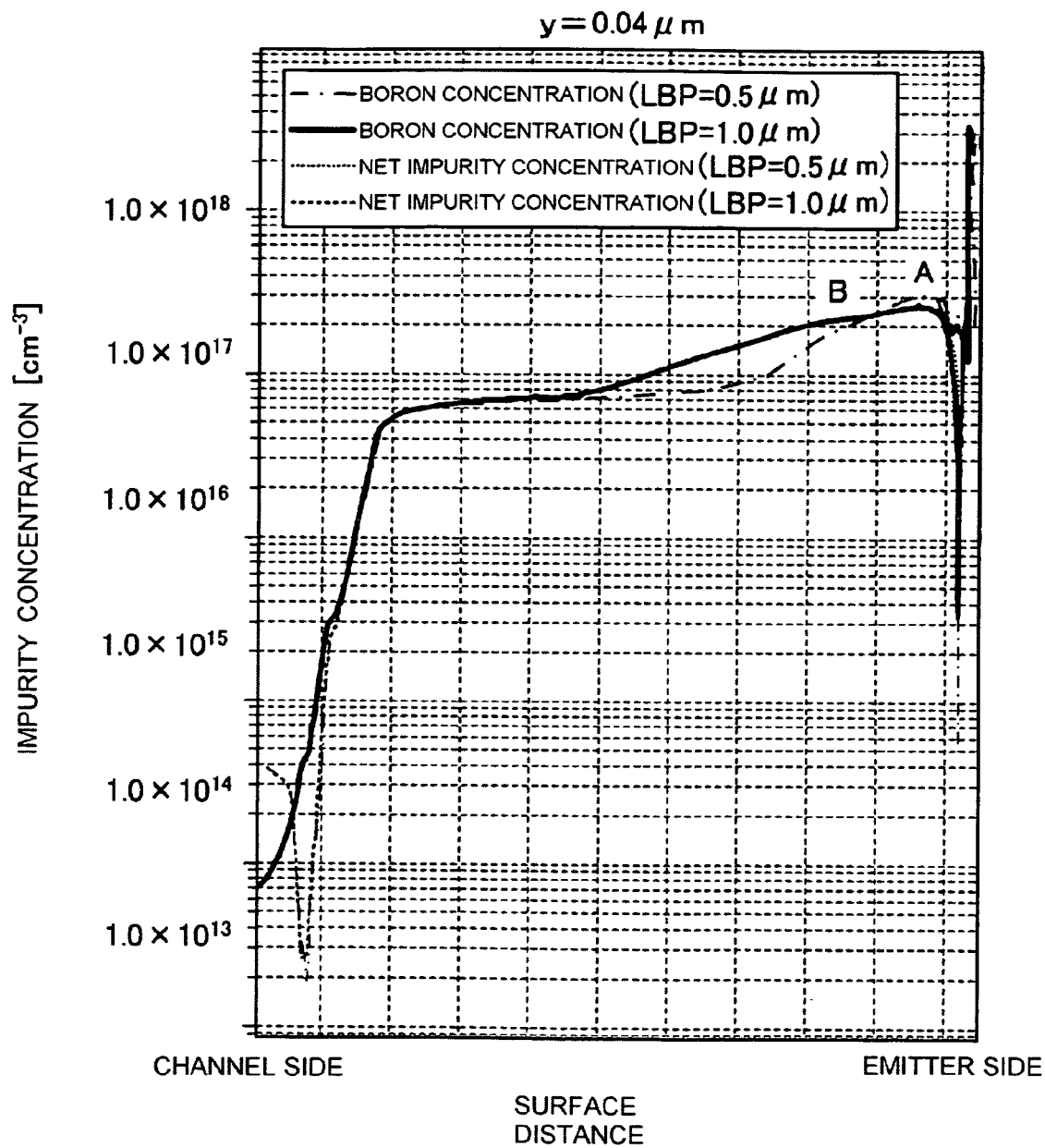
FIG. 12 is a graph showing impurity concentration profiles along arrow I in FIG. 1.

Next, the relationship between the width LBP and the impurity concentration will be described. FIG. 12 is a graph showing the impurity concentration at the interface (indicated by arrow I) between the gate insulating film 10 and the p-type body region 4 shown in FIG. 1. FIG. 12 shows results of simulations in which impurity concentration profiles along the path arrow I, shown in FIG. 1, were estimated by a Monte Carlo method in the case where the width LBP was assumed to be 0.5 μm and 1.0 μm. The low-resistivity region 41 was formed before formation of the gate insulating film 11 by implanting boron ions at an acceleration energy of 150 keV at a dose of $5\times10^{13}$ cm$^{-2}$ and performing annealing at 950° C. for 30 minutes in a nitrogen atmosphere.

In FIG. 12, a chain line and a thick solid line indicate boron concentration profiles for the cases in which the width LBP is equal to 0.5 μm and 1.0 μm, respectively. A thin broken line represents a net impurity concentration profile (i.e., a profile of the lateral diffusion for forming the p-type body region 4 plus a profile of the ion implantation for forming the low-resistivity region 41 plus a profile of the n⁻ drift region 3 plus a profile of the n$^{++}$ emitter region 5) of the case that the width LBP is equal to 0.5 μm. A thick broken line represents a net impurity profile of the case that the width LBP is equal to 1.0 μm. In FIG. 12, the thin broken line and the thick broken line coincide with the thick solid line in a wide distance range.

As shown in FIG. 12, where the width LBP is equal to 0.5 μm, a local maximum of the impurity concentration profile of the ion implantation and a local maximum of the impurity concentration profile of the lateral diffusion are both located at position A. On the other hand, where the width LBP is equal to 1.0 μm, a local maximum of the impurity concentration profile of the ion implantation is located at position B. That is, in this case, the impurity concentration profile of the ion implantation and that of the lateral diffusion have different local maximum positions. Therefore, the device threshold value is not dominated by the impurity concentration profile of the ion implantation. On the other hand, where the width LBP is equal to 0.5 μm, the impurity concentration profile of the ion implantation and that of the lateral diffusion have the same local maximum A. The device threshold value is determined by the impurity concentration at position A. The device threshold voltage in the case that the width LBP is equal to 0.5 μm is thus higher than that in the case that the width LBP is equal to 1.0 μm.

Figure 13:
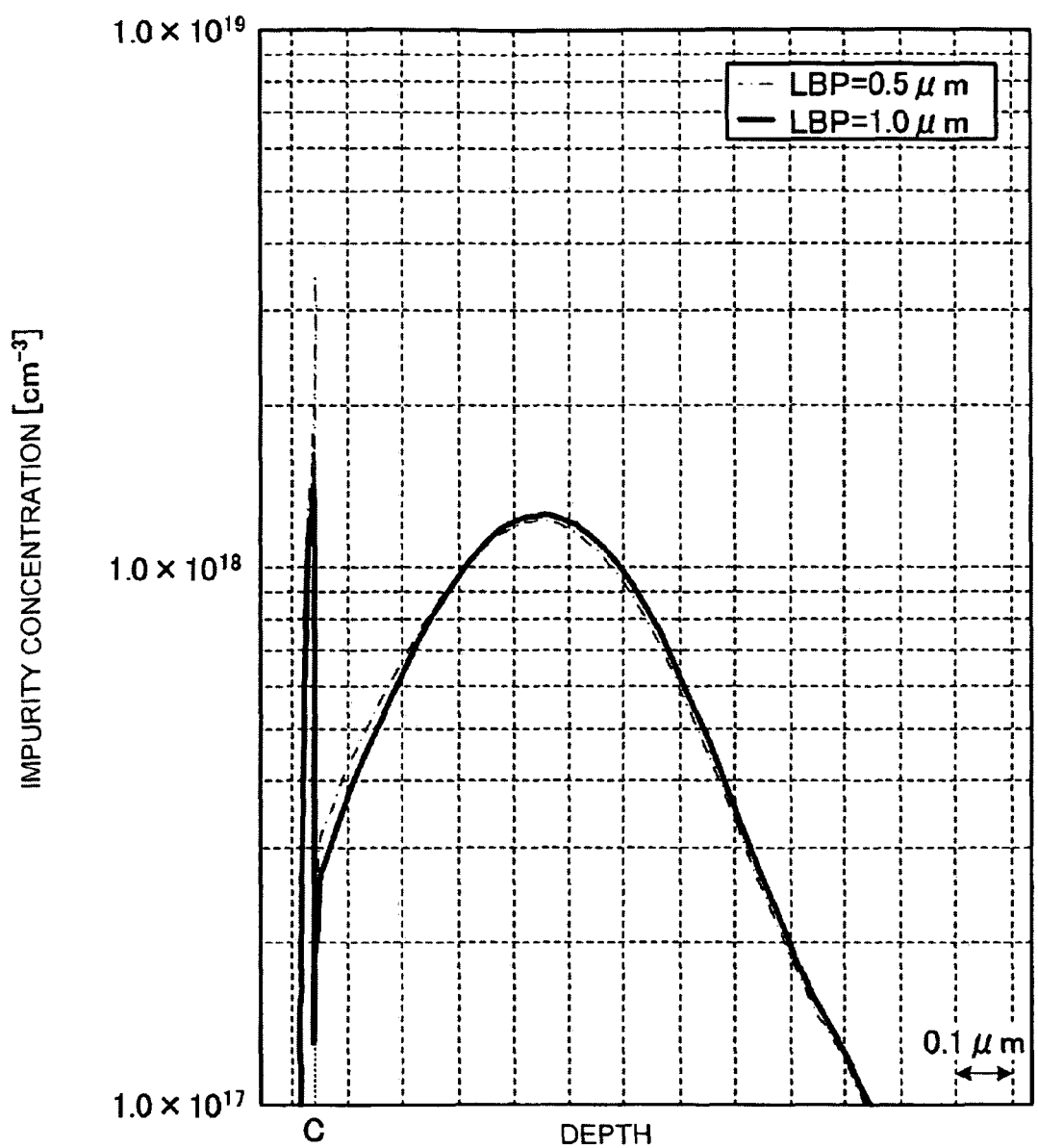
FIG. 13 is a graph showing impurity concentration profiles along arrow II in FIG. 1.

FIG. 13 is a graph showing impurity concentration profiles along arrow II in FIG. 1. As shown in FIG. 1, arrow II is perpendicular to the gate insulating film 10 and is spaced from the emitter-side end of the gate electrode 11 by 0.5 μm. In FIG. 13, the horizontal axis represents the depth as measured from that position at the interface between the p-type body region 4 and the gate insulating film 10 which is spaced from the emitter-side end of gate electrode 11 by 0.5 μm. In FIG. 13, the above reference position is indicated by character C. The vertical axis represents the impurity concentration. The channel length of the semiconductor device according to the first embodiment is 1.4 to 2.1 μm.

As shown in FIG. 13, the impurity concentration at the interface between the p-type body region 4 and the gate insulating film 10 is equal to $2\times10^{17}$ cm$^{-3}$. Under the channel region, the impurity concentration is three or more times higher than at the interface between the p-type body region 4 and the gate insulating film 10. It is thus understood that the impurity concentration of the low-resistivity region 41 is higher and the resistivity of the low-resistivity region 41 is lower than that of the interface between the p-type body region 4 and the gate insulating film 10.

The base Gummel number which relates to the amplification efficiency of the npn bipolar transistor that is composed of the n$^{++}$ emitter region 5, the p-type low-resistivity region 41, the p-type body region 4, and the n⁻ drift region 3 is large in a portion indicated by numeral 31 in FIG. 1. As a result, the amplification efficiency of the npn bipolar transistor is small and the latch-up phenomenon can be suppressed. The device's short-circuit ruggedness is thus increased.

Figure 14:
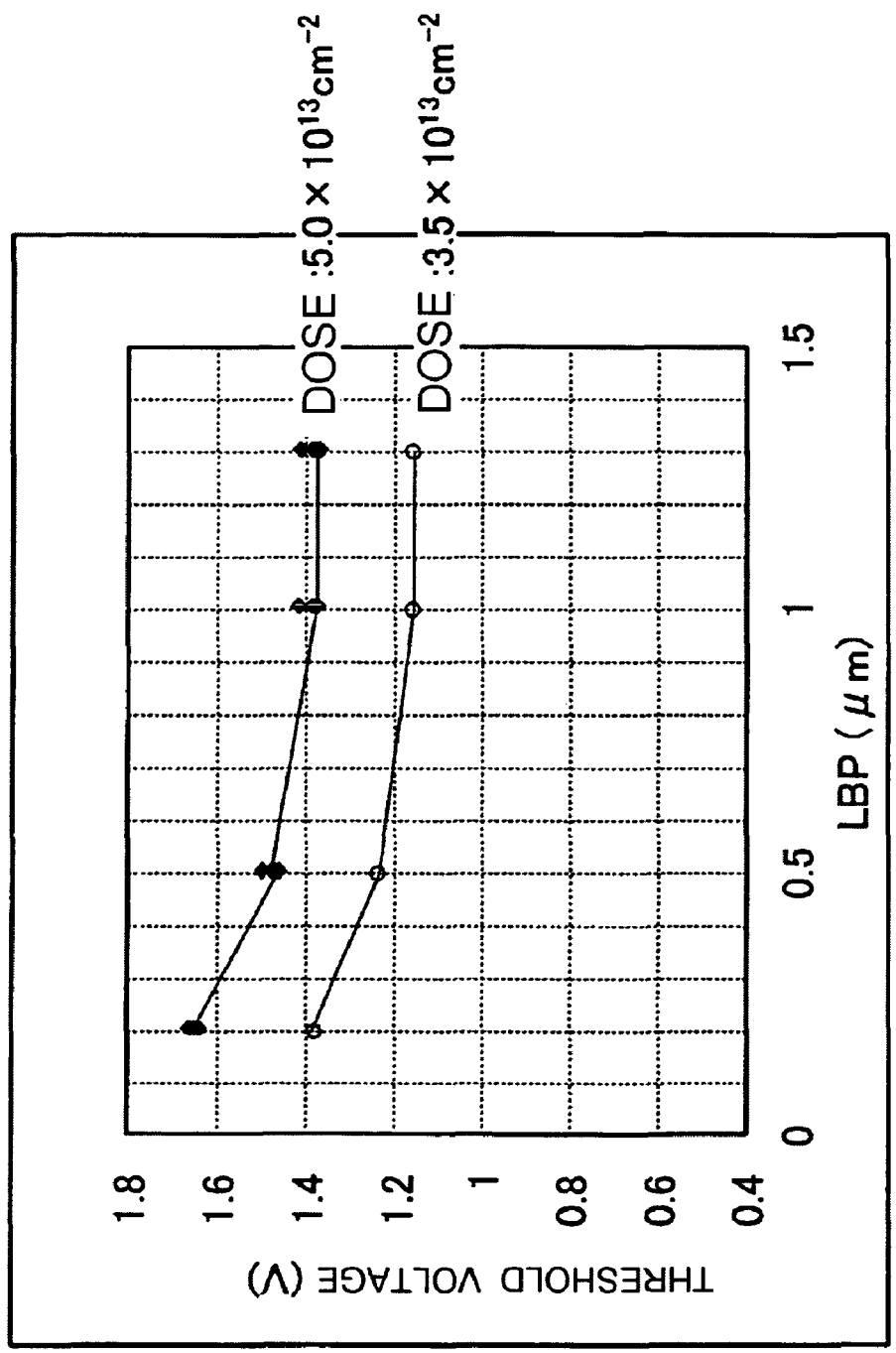
FIG. 14 is a graph showing relationships between the width LBP and the device threshold voltage.

Next, the relationship between the width LBP and the device threshold voltage will be described. FIG. 14 is a graph showing relationships between the width LBP and the device threshold voltage. The horizontal axis represents the width LBP and the vertical axis represents the threshold voltage.

The threshold voltage is the gate-emitter voltage $V_{GE}$ obtained under conditions that the collector-emitter voltage $V_{CE}$ is 5 V and the collector-emitter current $I_{CE}$ is 1 μA. FIG. 14 shows measurement results obtained in cases that the dose of boron ions was $3.5\times10^{13}$ and $5.0\times10^{13}$ cm$^{-2}$. As shown in FIG. 14, with either dose, the threshold voltage decreases steeply with the width LBP until the width LBP reaches 0.5 μm. The rate of decrease of the threshold voltage is low in an LBP range of 0.5 μm to 1.0 μm. The threshold voltage is constant in an LBP range that is greater than 1.0 μm. Therefore, it is preferable that the width LBP be greater than 0.5 μm and it is even preferable that it be greater than or equal to 1.0 μm.

Figure 15:
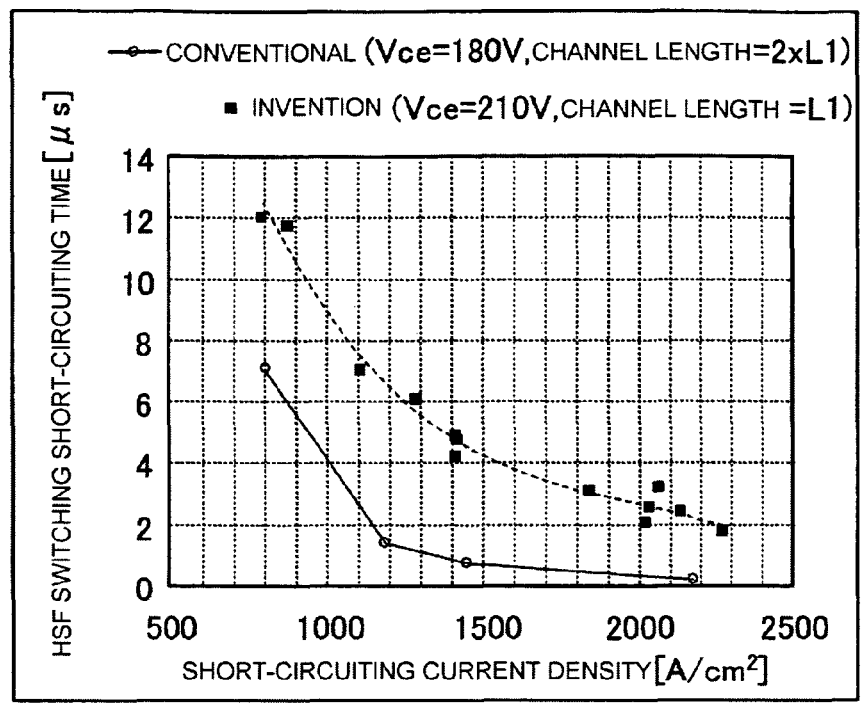
FIG. 15 is a graph showing relationships between the HSF switching short-circuiting time and the short-circuiting current density in the semiconductor device according to the first embodiment and a conventional semiconductor device.

Next, a description will be made of the relationship between the HSF switching short-circuiting time and the short-circuiting current density in each of the semiconductor device according to the first embodiment and a conventional semiconductor device. FIG. 15 shows relationships between the HSF switching short-circuiting time and the short-circuiting current density in the semiconductor device according to the first embodiment and a conventional semiconductor device. In FIG. 15, the vertical axis represents the HSF switching short-circuiting time and the horizontal axis represents the short-circuiting current density. The dose of boron ions was $2.5\times10^{13}$ to $5.0\times10^{13}$ cm$^{-2}$. In FIG. 15, solid squares (■) represent data of the semiconductor device according to the first embodiment obtained in a case that the collector-emitter voltage $V_{CE}$ was set at 210 V and circles (○) represent data of the conventional semiconductor device obtained in a case that the collector-emitter voltage $V_{CE}$ was set at 180 V.

As seen from FIG. 15, for the same HSF switching short-circuiting time, the short-circuiting current density of the semiconductor device according to the first embodiment is two times or more larger than that of the conventional semiconductor device. For the same short-circuiting current density, the HSF switching short-circuiting time of the semiconductor device according to the first embodiment is about two times larger than that of the conventional semiconductor device.

Figure 16:
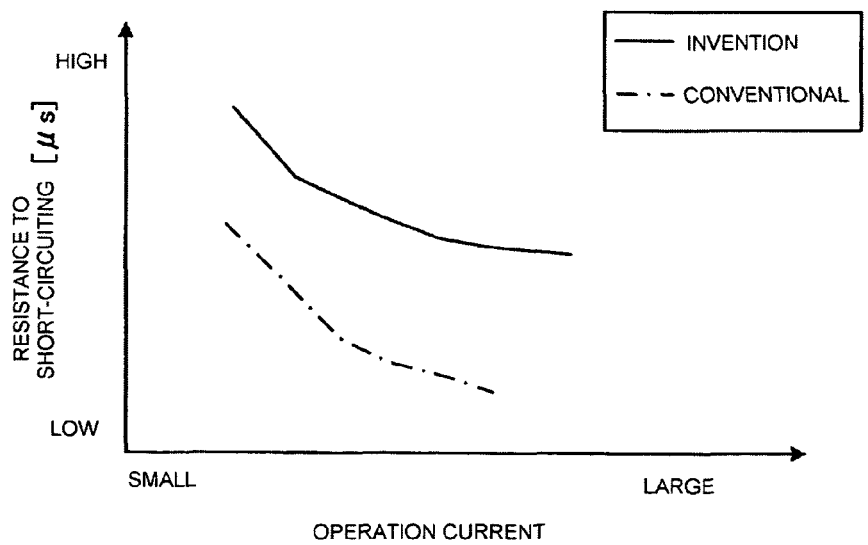
FIG. 16 is a graph showing relationships between the operation current and the resistance to short-circuiting.

FIG. 16 is a graph showing relationships between the operation current and the short-circuit ruggedness. In FIG. 16, the vertical axis represents the resistance to short-circuiting and the horizontal axis represents the operation current. The solid line represents a relationship between the operation current and the resistance to short-circuiting of the semiconductor device according to the first embodiment, and the chain line represents a relationship between the operation current and the resistance to short-circuiting of a conventional semiconductor device. It is assumed that the two kinds of semiconductor devices have the same channel length and threshold voltage (gate voltage). Where the emitter-collector voltage is constant, the operation current is controlled by the gate-emitter voltage.

In either kind of semiconductor device, as shown in FIG. 16, because of the operation speed limitation by heat dissipation, the resistance to short-circuiting decreases as the operation current increases and is saturated finally. It is seen from FIG. 16 that the resistance to short-circuiting decreases more steeply in the conventional semiconductor device than in the semiconductor device according to the first embodiment.

This is because in the semiconductor device according to the first embodiment the punchthrough phenomenon is suppressed more effectively.

In the MOSFET structure, the on-resistance comes to be dominated more by the resistance of the n⁻ drift region as the device breakdown voltage increases. On the other hand, the on-resistance comes to be influenced less by the channel resistance. That is, reduction of the channel length does not have much influence on the on-resistance or the on-current. Therefore, for example, in a MOSFET whose breakdown voltage is as high as 200 V, it is not very important to reduce the channel length.

On the other hand, in the IGBT structure, at on state, holes are injected from the p⁺ collector region to the n⁻ drift region. And electrons are injected from the interface between the p-type body region and the gate insulating film of the channel. The injection of holes and electrons causes conductivity modulation, as a result of which the resistance of the n drift region becomes several times to several hundred times smaller than in the case without conductivity modulation. Therefore, in IGBTs, the ratio between the resistance values of the channel region and the n⁻ drift region is important in reducing the on-resistance. The on-resistance can be reduced by reducing the channel length. When the channel length is reduced, more electrons are injected into the channel and the degree of conductivity modulation in the n⁻ drift region is increased. It is thus understood that reducing the channel length is effective in IGBTs. In the first embodiment, the channel length is set at 1.4 to 2.1 μm.

In the first embodiment, the impurity concentration profile along the interface between the gate insulating film 10 and the body region 4 has two local maxima. Therefore, the dose of the ion implantation for forming the low-resistivity region 41 is not restricted. Therefore, it is possible to form the low-resistivity region 41 so that it extends under the gate electrode 11 by a desired length. A semiconductor having high short-circuit ruggedness can be manufactured by setting the width LBP of the p⁺ low-resistivity region 41 (located under the gate electrode 11) greater than 0.5 μm, preferably greater than or equal to 1.0 μm.

Figure 17:
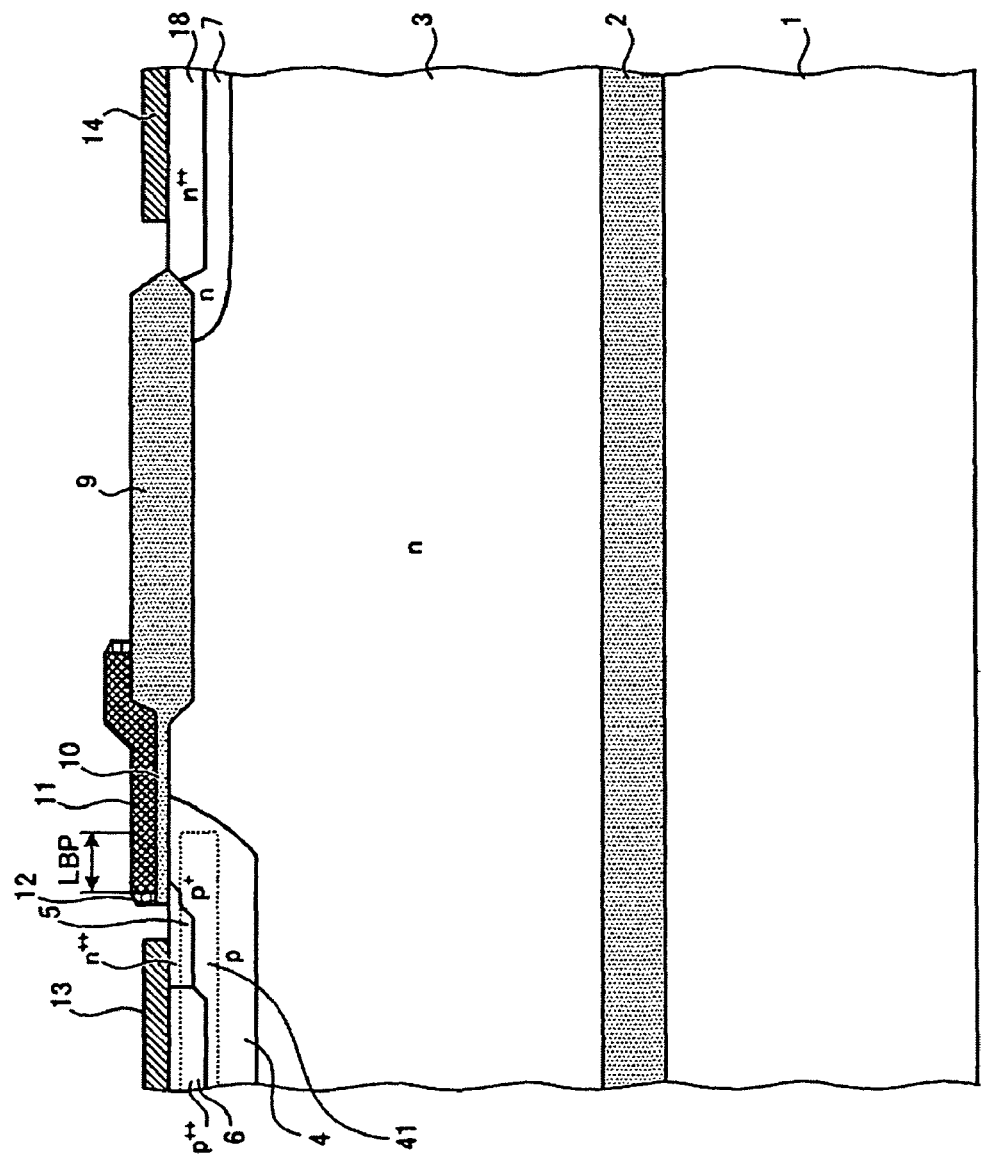
FIG. 17 shows the configuration of a semiconductor device according to a modification of the first embodiment.
Figure 18:
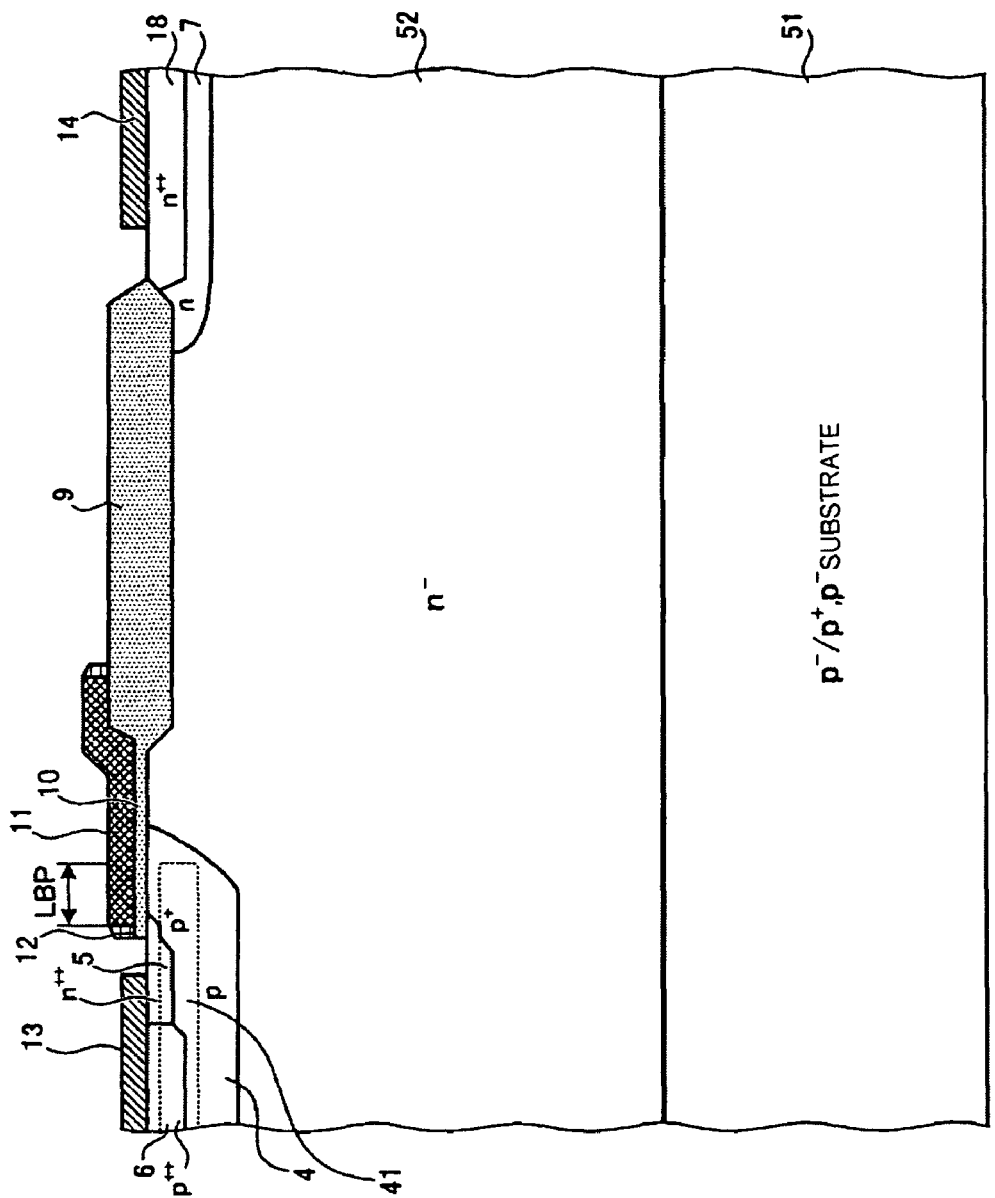
FIG. 18 shows the configuration of a semiconductor device according to another modification of the first embodiment.

Next, modifications of the semiconductor device according to the first embodiment will be described. FIGS. 17 and 18 show the configurations of modifications of the semiconductor device according to the first embodiment. The semiconductor device of FIG. 17 is different from that of FIG. 1 in that a low-resistivity n⁺⁺ drain region 18, rather than the p⁺⁺ collector region 8, is formed as a partial surface region of the n-type buffer region 7. As a result, the semiconductor device of FIG. 17 is a lateral MOSFET structure. The collector and the emitter of an IGBT structure are called a drain and a source, respectively, in the corresponding MOSFET structure. In this specification, the collector and the drain or the emitter and the source are denoted by the same reference symbol because they have the same structure. The other part of the configuration and the other part of the manufacturing method are the same as in the first embodiment. Therefore, the same layers, regions, or the like as in the first embodiment are denoted by the same reference symbols as in the first embodiment and will not be described. The semiconductor device having the lateral MOSFET structure can thus provide the same advantages as the semiconductor device according to the first embodiment.

The semiconductor device of FIG. 18 is different from the semiconductor devices of FIGS. 1 and 17 in that it is manufactured by using a p-type bulk substrate 51 rather than the SOI substrate. An n drift layer 52 is formed on the p-type bulk substrate 51. The other part of the configuration and the other part of the manufacturing method are the same as in the first embodiment. Therefore, the same layers, regions, or the like as in the first embodiment are denoted by the same reference symbols as in the first embodiment and will not be described. The semiconductor device manufactured by using the bulk substrate can thus provide the same advantages as the semiconductor device according to the first embodiment.

Embodiment 2

Figure 19:
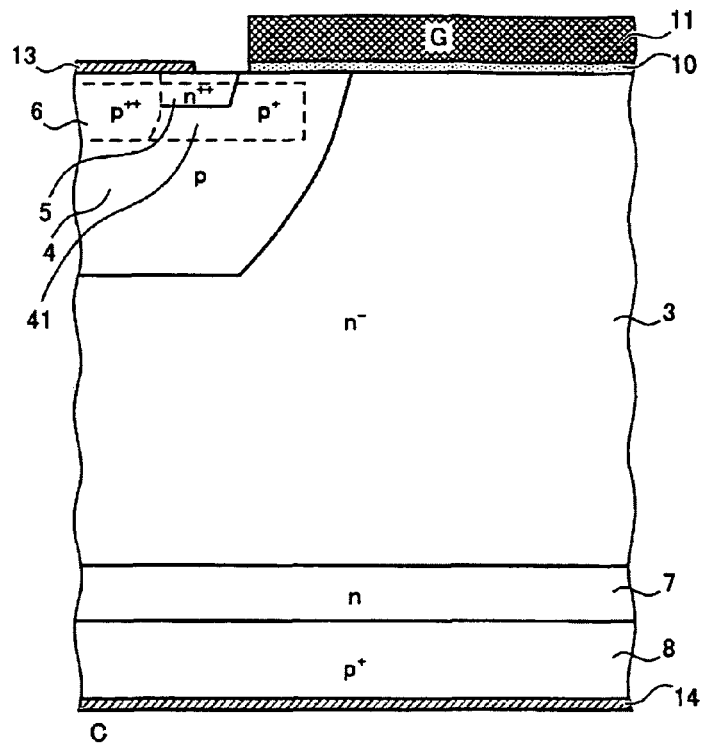
FIG. 19 shows the configuration of a semiconductor device according to a second embodiment of the invention.

FIG. 19 shows the configuration of a semiconductor device according to the second embodiment. As shown in FIG. 19, the semiconductor device according to the second embodiment is different from the semiconductor device according to the first embodiment in that the n-type buffer region 7, the p⁺ collector region 8, and the collector electrode 14 are formed adjacent to the surface of the n⁻ drift region 3 which is opposite to its surface that is formed with the p-type body region 4. As a result, the semiconductor device according to the second embodiment is a vertical IGBT structure. The semiconductor device having the vertical IGBT structure can be manufactured by using a p⁺ substrate to serve as the p⁺ collector region 8. The n-type buffer region 7 is formed on one major surface of the p⁺ substrate and the n⁻ drift region 3 is formed on the surface of the n-type buffer region 7. The collector electrode 14 is formed on the other major surface of the p⁺ substrate. The other part of the configuration and the other part of the manufacturing method are the same as in the first embodiment. Therefore, the same layers, regions, or the like as in the first embodiment are denoted by the same reference symbols as in the first embodiment and will not be described.

The vertical semiconductor device according to the second embodiment can provide the same advantages as the semiconductor device according to the first embodiment.

Embodiment 3

Figure 20:
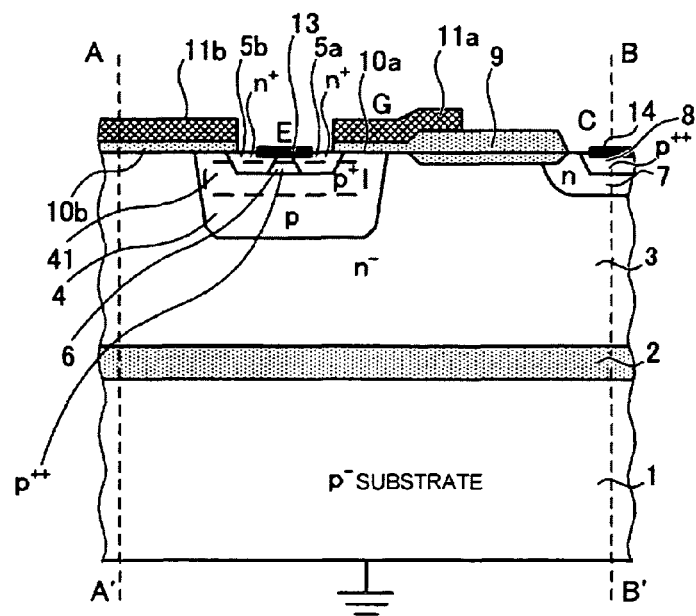
FIG. 20 shows the configuration of a semiconductor device according to a third embodiment of the invention.

FIG. 20 shows the configuration of a semiconductor device according to the third embodiment. As shown in FIG. 20, the semiconductor device according to the third embodiment is different from the semiconductor device according to the first embodiment in that the first n⁺ emitter region 5a and a second n⁺ emitter region 5b are formed in the p-type body region 4 and disposed away from each other. The p⁺⁺ contact region 6 is formed between the first n⁺ emitter region 5a and the second n⁺ emitter region 5b so as to be in contact with them. The p⁺ low-resistivity region 41 is formed to surround the interfaces between the p-type body region 4 and the first n⁺ emitter region 5a, the p⁺⁺ contact region 6, and the second n⁺ emitter region 5b.

The emitter electrode 13 is formed so as to be in contact with the first n⁺ emitter region 5a, the p⁺ contact region 6, and the second n⁺ emitter region 5b and short-circuits them. The first gate insulating film 10a which is in contact with the insulating film 9 is formed on part of the surface of the first n⁺ emitter region 5a, the associated surface of the p-type body region 4, and the associated surface of the n⁻ drift region 3. The first gate electrode 11a is formed on part of the insulating film 9 and the first gate insulating film 10a. The second gate insulating film 10b is formed on part of the surface of the second n⁺ emitter region 5b, the associated surface of the p-type body region 4, and the associated surface of the n⁻ drift region 3. The second gate electrode 11b is formed on the second gate insulating film 10b.

The semiconductor device according to the third embodiment is symmetrical with respect to each of line segments A-A' and B-B' shown in FIG. 20. In this manner, the semiconductor device according to the third embodiment has a multi-channel structure in which plural channels are formed so as to share the single drift region 3. The other part of the configuration is the same as in the first embodiment. Therefore, the same layers, regions, or the like as in the first embodiment are denoted by the same reference symbols as in the first embodiment and will not be described.

The semiconductor device having the multi-channel structure according to the third embodiment can provide the same advantages as the semiconductor devices according to the first and second embodiments.

Embodiment 4

Figure 21:
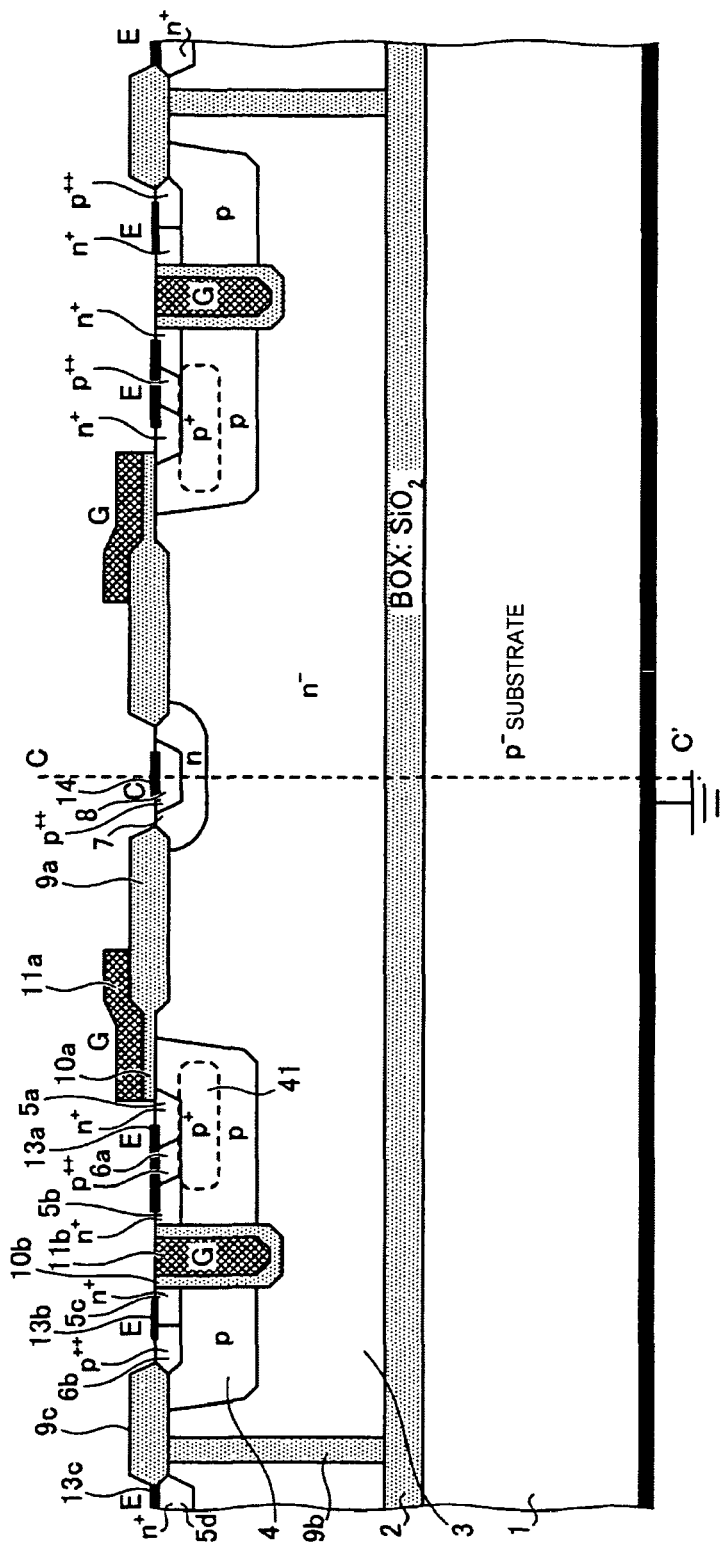
FIG. 21 shows the configuration of a semiconductor device according to a fourth embodiment of the invention.
Figure 22:
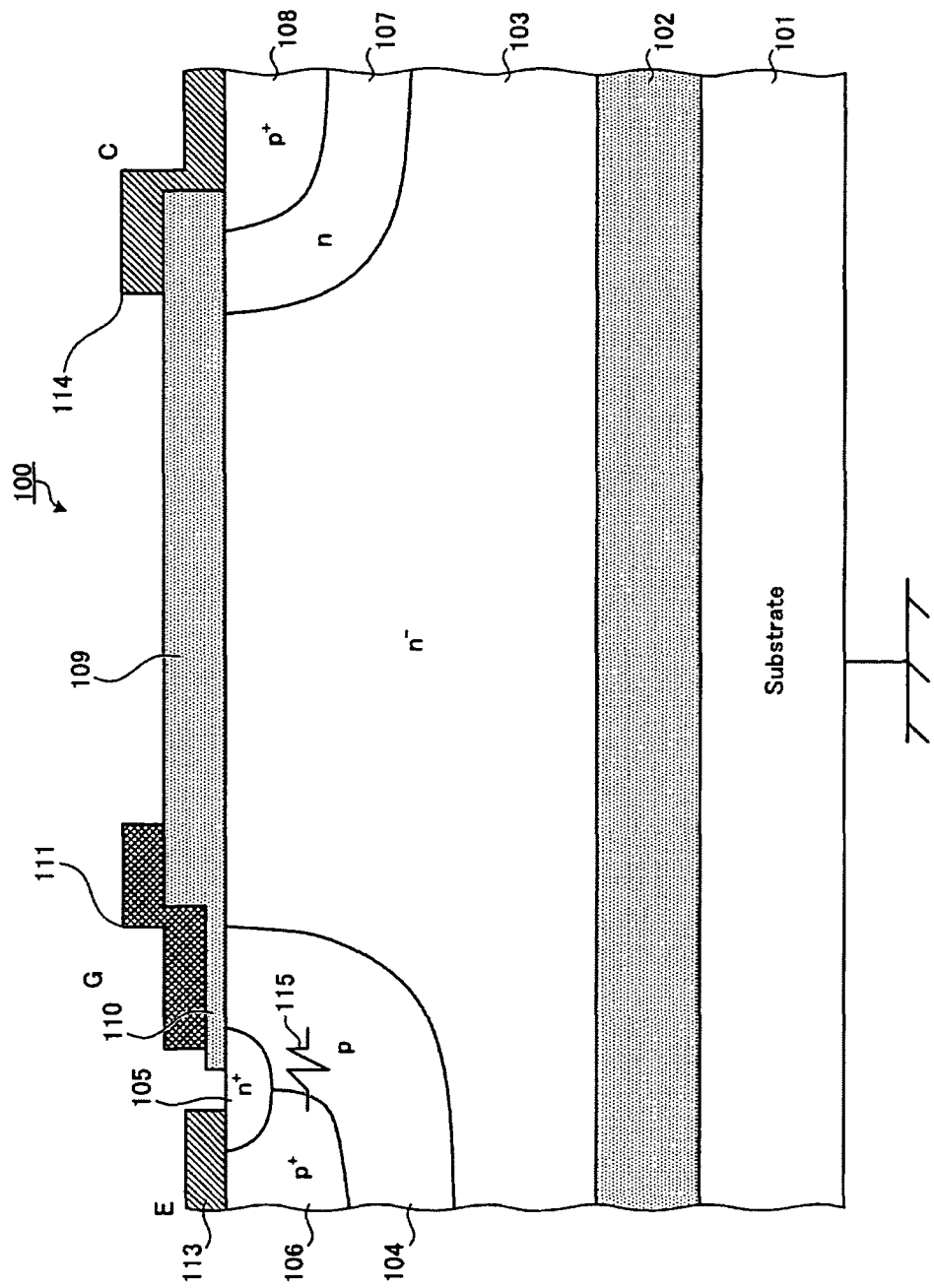
FIGS. 22-27 show the configurations of example power devices having conventional structures.
Figure 23:
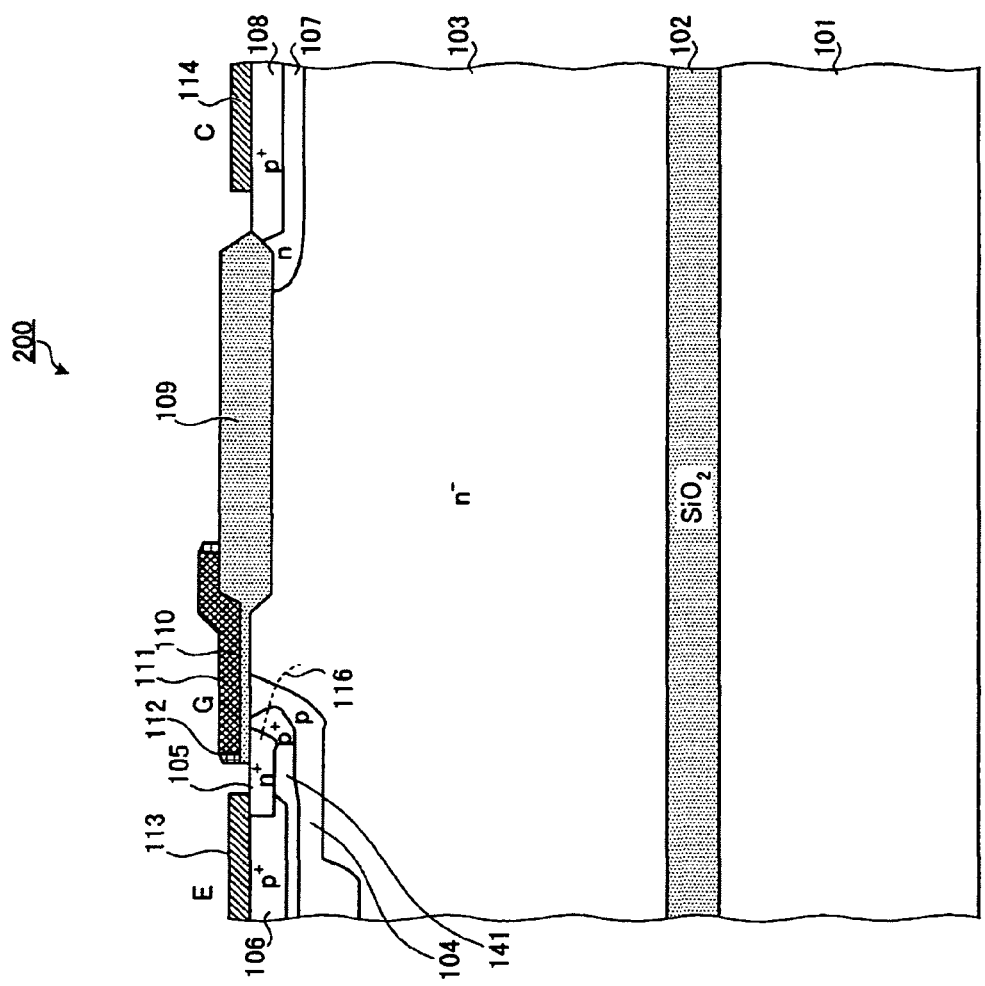
Figure 24:
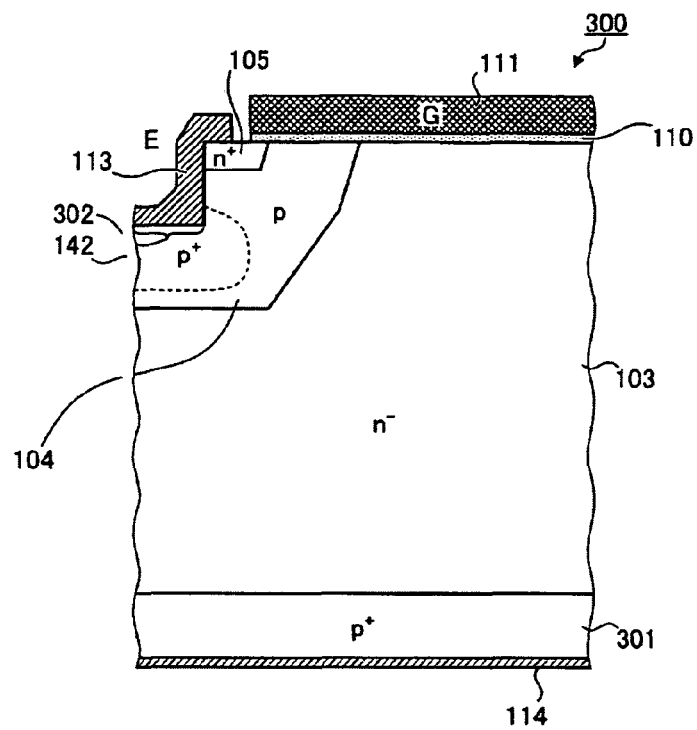
Figure 25:
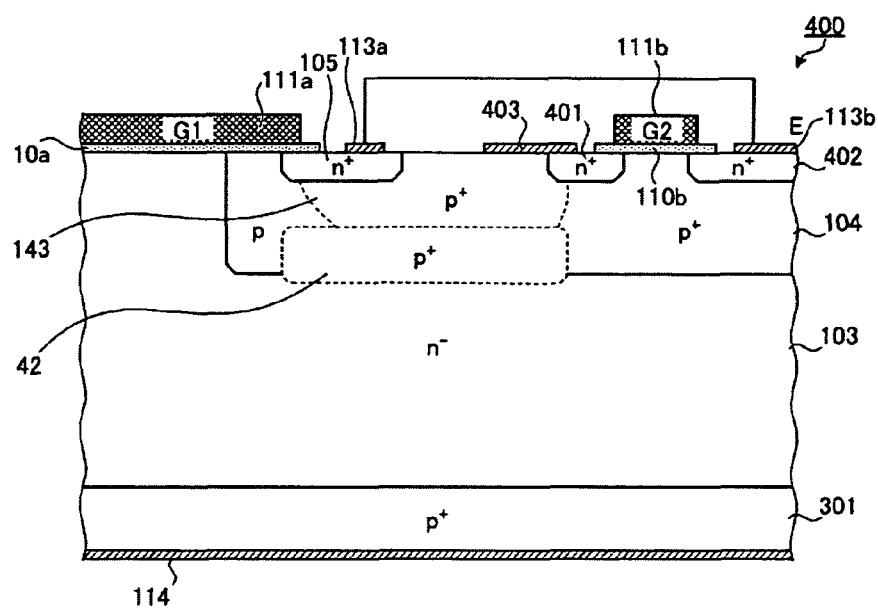
Figure 26:
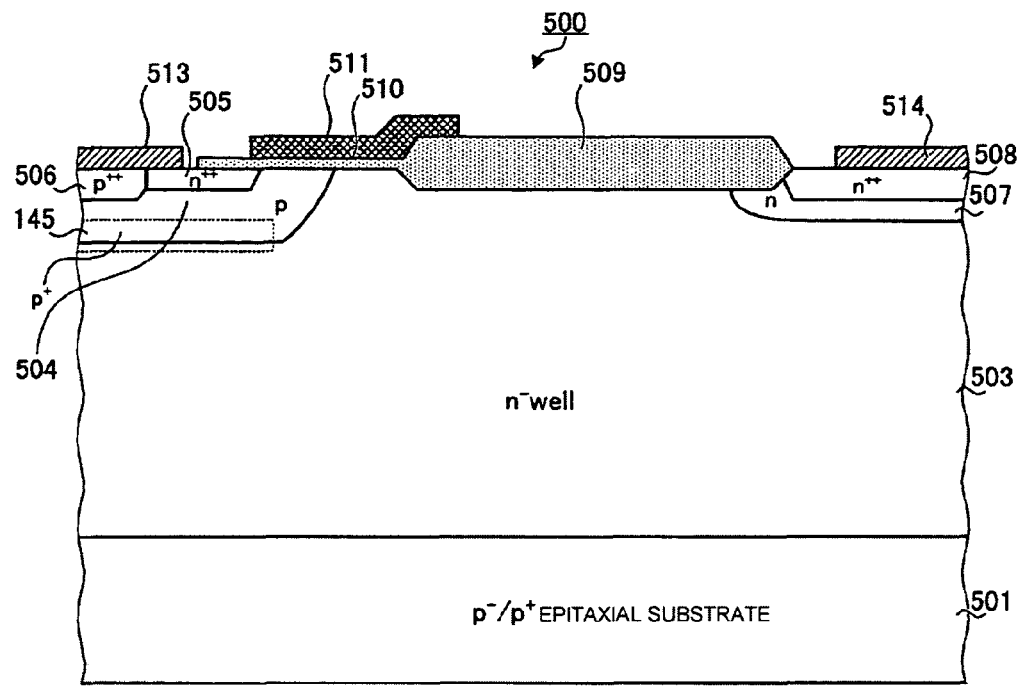
Figure 27:
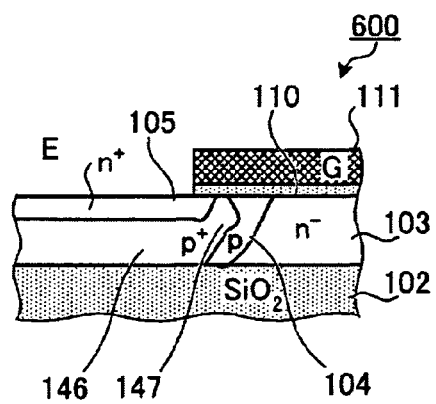

FIG. 21 shows the configuration of a semiconductor device according to the fourth embodiment. As shown in FIG. 21, the semiconductor device according to the fourth embodiment is symmetrical with respect to a center line C-C'. Only the structure located on the left side of the center line C-C' will be described below. As shown in FIG. 21, the semiconductor device according to the fourth embodiment is different from the semiconductor device according to the third embodiment in that a device having a planar gate structure and a device having a trench gate structure are formed on a single substrate.

The first $n^+$ emitter region 5a, a second $n^+$ emitter region 5b, and a third $n^+$ emitter region 5c are formed in the p-type body region 4 and disposed away from each other. The first $p^{++}$ contact region 6a is formed as a partial surface region of the p-type body region 4 between the first $n^+$ emitter region 5a and the second $n^+$ emitter region 5b so as to be in contact with them. A first trench is formed through the p-type body region 4 between the second $n^+$ emitter region 5b and the third $n^+$ emitter region 5c so as to be adjacent to them and to reach the n drift region 3. A second $p^{++}$ contact region 6b is formed as a partial surface region of the p-type body region 4. The second $p^{++}$ contact region 6b is separated from the first trench by the third $n^+$ emitter region 5c. The $p^+$ low-resistivity region 41 is formed to surround the interfaces between the p-type body region 4 and the first $n^+$ emitter region 5a, the first $p^{++}$ contact region 6a, and the second $n^+$ emitter region 5b.

The first emitter electrode 13a is formed so as to be in contact with the first $n^+$ emitter region 5a, the first $p^+$ contact region 6a, and the second $n^+$ emitter region 5b and short-circuits them. The second emitter electrode 13b is formed so as to be in contact with the second $p^{++}$ contact region 6b and the third $n^+$ emitter region 5c and short-circuits them. The first gate insulating film 10a which is in contact with the first insulating film 9a is formed on part of the surface of the first $n^+$ emitter region 5a, the associated surface of the p-type body region 4, and the associated surface of the $n^-$ drift region 3. The first gate electrode 11a is formed on part of the first insulating film 9a and the first gate insulating film 10a. The second gate electrode 11b is formed on the inside surface of the first trench with a second gate insulating film 10b interposed in between.

The second trench is formed through the $n^-$ drift region 3 at a position that is spaced from the p-type body region 4 so as to reach the BOX region 2. A second insulating film 9b is formed in the second trench. A fourth $n^+$ emitter region 5d is formed as a partial surface region of the $n^-$ drift region 3 so as to be separated from the p-type body region 4 by the second trench. The third emitter electrode 13c is formed so as to be in contact with the fourth $n^+$ emitter region 5d. The third insulating film 9c is formed on the associated surfaces of the $n^-$ drift region 3, part of the surface of the fourth $n^+$ emitter region 5d, the surface of the second insulating film 9b, the associated surface of the p-type body region 4, and part of the surface of the second $p^{++}$ contact region 6b. The other part of the configuration is the same as in the first embodiment. Therefore, the same layers, regions, or the like as in the first embodiment are denoted by the same reference symbols as in the first embodiment and will not be described.

The semiconductor device according to the fourth embodiment, having the multi-channel structure in which the device having the planar gate structure and the device having the trench gate structure, are formed on the single substrate and can provide the same advantages as the semiconductor devices according to the first, second, and third embodiments.

The invention is not limited to the above embodiments and various modifications are possible. For example, the dimensions, concentrations, etc. specified in the embodiments are just examples; in the invention, these parameters are not limited to the specified values. In each embodiment, the first and second conductivity types are the n type and the p type, respectively, the invention likewise holds even if the first and second conductivity types are the p type and the n type, respectively.

The semiconductor devices and their manufacturing methods according to the invention are useful when used as or for power devices for vehicular engine control or driving circuits of plasma displays. In particular, they are suitably used as or for semiconductor devices in which a low-resistivity region which is lower in resistivity than a body region is formed in the body region.

What is claimed is:

1. A manufacturing method of a semiconductor device, comprising the steps of:
    forming a drift region of a first conductivity type in a semiconductor layer;
    forming a body region of a second conductivity type adjacent a surface of the drift region;
    forming a low-resistivity region of the second conductivity type in the body region, the low-resistivity region being lower in resistivity than the body region;
    forming a first semiconductor region of the first conductivity type on a surface region of the body region;
    forming a contact region on a surface region of the body region, the contact region being formed in contact with the first semiconductor region and being lower in resistivity than the body region;
    forming an insulating film on the surface of the drift region;
    forming a gate insulating film on the surface of the body region between the first semiconductor region and the drift region;
    annealing, at 900° C. to 960° C. for 20 to 40 minutes in a nitrogen atmosphere, to repair crystal lattice disorder occurring during the forming the low-resistivity region and preventing excessive diffusion from occurring in the low resistivity region, the annealing step occurring between the forming of the low-resistivity region and the forming of the gate insulating film;
    forming a gate electrode on the gate insulating film, the gate electrode being formed after the step of forming a low-resistivity region has been conducted; and
    forming a first semiconductor electrode in contact with the first semiconductor region and the contact region.

2. The manufacturing method of a semiconductor device according to claim 1, further comprising:
    forming a second semiconductor region of either the first or the second conductivity type adjacent the surface of the drift region, the second semiconductor region being disposed away from the body region; and forming a second semiconductor electrode in contact with the second semiconductor region.

3. The manufacturing method of a semiconductor device according to claim 1, further comprising:

forming another second semiconductor region of the second conductivity type, wherein the drift region is formed on a major surface of the another second semiconductor region.

4. The manufacturing method of a semiconductor device according to claim 1, wherein the step of forming the body region is conducted using lateral diffusion, and the step of forming the low-resistivity region is conducted using ion implantation.

5. The manufacturing method of a semiconductor device according to claim 2, wherein the second semiconductor region is of the second conductivity type, the first semiconductor region is an emitter region, and the first semiconductor electrode is an emitter electrode, the second semiconductor region is a collector region, and the second semiconductor electrode is a collector electrode, and the step of forming the emitter region is executed after the step of forming the gate electrode.

6. The manufacturing method of a semiconductor device according to claim 2, wherein the second semiconductor region is of the second conductivity type, the first semiconductor region is a source region, and the first semiconductor electrode is a source electrode, the second semiconductor region is a drain region, and the second semiconductor electrode is a drain electrode, and the step of forming the source region is executed after the step of forming the gate electrode.

7. The manufacturing method of a semiconductor device according to claim 3, wherein the first semiconductor region is an emitter region, and the first semiconductor electrode is an emitter electrode, the second semiconductor region is a collector region, and the second semiconductor electrode is a collector electrode, and the step of forming the collector region is executed after the step of the forming the gate electrode.

8. The manufacturing method of a semiconductor device according to claim 3, wherein the first semiconductor region is a source region, and the first semiconductor electrode is a source electrode, the second semiconductor region is a drain region, and the second semiconductor electrode is a drain electrode, and the step of forming the drain region is executed after the step of forming the gate electrode.

9. The manufacturing method of a semiconductor device according to claim 4, wherein the step of forming the low-resistivity region includes implanting boron ions at an acceleration energy of 100 to 200 keV.

10. The manufacturing method of a semiconductor device according to claim 4, wherein the step of forming the low-resistivity region includes implanting boron ions at a dose of $1 \times 10^{13}$ to $5 \times 10^{13}$ cm$^{-2}$.

* * * * *